United States Patent

Maruyama et al.

[11] Patent Number: 6,100,760
[45] Date of Patent: Aug. 8, 2000

[54] VARIABLE GAIN AMPLIFIER

[75] Inventors: Takaya Maruyama; Hisayasu Satoh; Takahiro Miki, all of Tokyo, Japan

[73] Assignee: Mitsubishi Denki Kabushiki Kaisha, Tokyo, Japan

[21] Appl. No.: 09/090,240

[22] Filed: Jun. 4, 1998

[51] Int. Cl.[7] .................................................. H03F 3/45
[52] U.S. Cl. ........................................ 330/254; 327/359
[58] Field of Search .............................. 330/254; 327/359

[56] References Cited

U.S. PATENT DOCUMENTS

| | | | |
|---|---|---|---|
| 4,019,118 | 4/1977 | Harwood | 321/65 |
| 4,128,817 | 12/1978 | Gomi | 331/177 R |
| 5,621,358 | 4/1997 | Pisati et al. | 330/253 |
| 5,734,295 | 3/1998 | Kagawa | 329/305 |
| 5,821,810 | 10/1998 | Swart et al. | 330/254 |

*Primary Examiner*—Robert Pascal
*Assistant Examiner*—Henry Choe
*Attorney, Agent, or Firm*—Burns, Doane, Swecker & Mathis, LLP

[57] ABSTRACT

Current controllers (C1 and C2) are connected to a power source (Vcc) in common through a load (L). Inputs of the current controllers (C1 and C2) are connected to outputs of current amplifier parts (A1 and A2) respectively, and the current amplifier parts (A1 and A2) are connected to a ground level (GND) through constant current sources (CS1 and CS2) respectively. The current amplifier part (A1) has a high gain, and the current amplifier part (A2) has a low gain. Thus, a variable gain amplifier whose input range does not abruptly change with respect to a control voltage is obtained, and a variable gain amplifier widening its input range is provided.

19 Claims, 12 Drawing Sheets

VARIABLE GAIN AMPLIFIER

BACKGROUND OF THE INVENTION

1. Field of the Invention

The present invention relates to a variable gain amplifier, and more particularly, it relates to a variable gain amplifier widening its input range.

2. Description of the Background Art

In a transmitter/receiver for radio communication such as mobile communication, the signal strength may extremely vary with environmental factors. In order to more correctly transmit/receive signals, power control is necessary for increasing or reducing the gain of an amplifier if the signal strength is small or large. A variable gain amplifier capable of varying its gain with the signal strength is employed for such power control.

<Device Structure>

FIG. 13 shows the structure of a conventional variable gain amplifier 90. As shown in FIG. 13, the variable gain amplifier 90 comprises a high-gain differential amplifier 1 and a low-gain differential amplifier 2 having common resistances (load resistances) R1 and R2. The resistances R1 and R2 have the same resistance value $R_L$.

The differential amplifier 1 has NPN transistors Q1 and Q2 whose collector electrodes are connected to the resistances R1 and R2, having the resistance value $R_L$, which are connected to a power source Vcc in common. The emitter electrodes of the transistors Q1 and Q2 are connected to the collector electrodes of NPN transistors Q3 and Q4 respectively, and connected in common with each other through a resistance (feedback resistance) R3. The emitter electrode of the transistor Q3 is connected to the collector electrode of an NPN transistor Q5, whose emitter electrode is connected to a ground level GND through a resistance R4.

The differential amplifier 2 has NPN transistors Q6 and Q7 whose collector electrodes are connected to the resistances R1 and R2 which are connected to the power source Vcc in common. The emitter electrodes of the transistors Q6 and Q7 are connected to the collector electrodes of NPN transistors Q8 and Q9 respectively, and connected in common with each other through a resistance (feedback resistance) R5. The emitter electrode of the transistor Q9 is connected to the collector electrode of an NPN transistor Q10, whose emitter electrode is connected to the ground level GND through a resistance R6.

The base electrodes of the transistors Q1 and Q6 are connected to an input terminal T1, those of the transistors Q2 and Q6 are connected to an input terminal T2, those of the transistors Q3 and Q4 are connected to a control terminal T3, those of the transistors Q8 and Q9 are connected to a control terminal T4, those of the transistors Q5 and Q10 are connected to a variable bias input terminal T5, the collector electrodes of the transistors Q2 and Q7 are connected to an output terminal T6, and those of the transistors Q1 and Q6 are connected to an output terminal T7.

Further, the emitter electrodes of the transistors Q8 and Q4 are connected to the collector electrodes of the transistors Q5 and Q10 respectively.

A circuit formed by the transistors Q3, Q4, Q8 and Q9 is referred to as a control circuit 3, and that formed by the transistors Q5 and Q10 and the resistances R4 and R6 is referred to as a variable current source 4.

The resistances R3 and R5, which are feedback resistances, have values $R_{EG}$ and $R_{EL}$ respectively, in the relation $R_{EG} < R_{EL}$.

In general, the gain variability with respect to a control voltage and an input range characteristic indicating an allowable input range causing no output distortion are regarded as the important performance of a variable gain amplifier. The gain variability and the input range characteristic of the variable gain amplifier 90 are now described.

<Gain Variability>

The gain variability is now described. The respective gains $G_{OG}$ and $G_{OL}$ of the differential amplifiers 1 and 2 and the total gain $G_{OT}$ of the variable gain amplifier 90 can be expressed in the following numerical formulas (1), (2) and (3) respectively:

$$G_{OG} = 20 \log_{10} \left[ \frac{R_L}{\frac{V_T}{I_{QOG}(Vct)} + R_{EG}} \right] \quad (1)$$

$$G_{OL} = 20 \log_{10} \left[ \frac{R_L}{\frac{V_T}{I_{QOL}(Vct)} + R_{EL}} \right] \quad (2)$$

$$G_{OT} = 20 \log_{10} \left[ \frac{R_L}{\frac{V_T}{I_{QOG}(Vct)} + R_{EG}} + \frac{R_L}{\frac{V_T}{I_{QOL}(Vct)} + R_{EL}} \right] \quad (3)$$

Referring to each of the numerical formulas (1) to (3), $V_T$ represents a thermal voltage, which is expressed in kT/q, where k represents the Boltzmann's constant, T represents the temperature, and q represents the elementary charge quantity. A control voltage Vct supplied between the control terminals T3 and T4 controls operating currents $I_{QOG}$ and $I_{QOL}$ of the differential amplifiers 1 and 2.

FIG. 14 shows exemplary change states of the operating current $I_{QOG}$ (the total of currents flowing through the transistors Q1 and Q2) and the operating current $I_{QOL}$ (the total of currents flowing through the transistors Q6 and Q7) of the differential amplifiers 1 and 2 with respect to change of the control voltage Vct. When the control voltage Vct shown on the horizontal axis of FIG. 14 is varied in the range of ±0.1 V, the operating currents $I_{QOG}$ and $I_{QOL}$ shown on the vertical axis vary in the range of substantially zero to the bias current $I_{EE}$ (the total of currents flowing through the resistances R4 and R6) of the differential amplifiers 1 and 2 respectively.

When the control voltage Vct is gradually reduced from such a state that most part of a current of a constant current source 4 flows to the differential amplifier 1, for example, the operating currents $I_{QOG}$ and $I_{QOL}$ reduce and increase respectively. Thus, it is understood that the gains $G_{OG}$ and $G_{OL}$ of the differential amplifiers 1 and 2 reduce and increase respectively from the numerical formulas (1) and (2). If an input signal is extremely large, therefore, it is possible to prevent an internal device (not shown) which is connected with the output terminals T6 and T7 from breaking due to excessive amplification of the input signal by reducing and increasing the gains $G_{OG}$ and $G_{OL}$ of the differential amplifiers 1 and 2 respectively. If the input signal is extremely small, on the other hand, it is possible to amplify the same to a level suitable for the internal device (not shown) by increasing the gain $G_{OG}$ of the differential amplifier 1.

Thus, the variable gain amplifier 90 comprising the high-gain differential amplifier 1 and the low-gain differential amplifier 2 can cope with an extremely large or small input signal by adjusting the control voltage Vct. In this case, however, the variable gain amplifier 90 simply adds up the currents flowing to the high-gain differential amplifier 1 and the low-gain differential amplifier 2 and feeds the total current to the resistances R1 and R2. If the difference between the gains G0G and G0L of the differential amplifiers 1 and 2 is remarkable, therefore, the gain G0G of the differential amplifier 1 is dominant. This phenomenon is now described with reference to FIG. 15.

Referring to FIG. 15, the horizontal and vertical axes show the control voltage Vct and the gains respectively. Symbols G0G, G0L and G0T denote the gain characteristics of the differential amplifiers 1 and 2 and the overall variable gain amplifier 90 respectively. It is understood from FIG. 15 that the gain of the differential amplifier 1 becomes dominant from the value of the control voltage Vct at which the gain characteristics G0G and G0L intersect with each other, such that the gain characteristic G0T substantially coincides with the gain characteristic G0G. Namely, the term VT/IQ0G is dominant in the numerical formula (1) and the gain characteristic G0G remarkably increases when the operating current IQ0G is small. On the other hand, the operating current IQ0L is large and decided by the resistance value REL in the numerical formula (2), and hence the gain characteristic G0L remains substantially unchanged. If the gain characteristic G0G exceeds the gain characteristic G0L, therefore, the gain characteristic G0G becomes dominant in the gain characteristic G0T, as understood from the numerical formula (3). If the operating current IQ0G increases, further, the operating current IQ0L reduces and the term VT/IQ0L becomes more dominant than the resistance value REL and the gain characteristic G0L reduces, to result in continuous domination of the gain characteristic G0G.

<Input Range Characteristic>

The input range characteristic is now described. The input range of a differential amplifier is generally decided by the product of the operating current and the feedback resistance. If the operating currents IQ0G and IQ0L are identical to each other, therefore, the differential amplifiers 1 and 2 have narrow and wide input ranges respectively due to the relation REG<REL between the resistance values REG and REL of the resistances R3 and R5 which are emitter feedback resistances. This is because the base-to-emitter voltages of the transistors Q1 and Q2 increase due to a small voltage drop in the resistance R3 and base-to-emitter voltages of the transistors Q6 and Q7 reduce due to a small voltage drop in the resistance R5.

In a region of the control voltage Vct where the operating current IQ0G of the differential amplifier 1 is sufficiently close to zero, e.g., in the region of −0.1 V to −0.05 V shown in FIG. 14, the input range of the differential amplifier 2 is so sufficiently wide that the differential amplifier 2 substantially decides the input range of the variable gain amplifier 90. If the control voltage Vct increases beyond this range, however, the input range of the differential amplifier 2 narrows while that of the differential amplifier 1 so widens that the differential amplifier 1 substantially decides the input range of the variable gain amplifier 90. However, the input range of the differential amplifier 1 is so set that the maximum value thereof is smaller than that of the input range of the differential amplifier 2 in order to attain higher gain than the differential amplifier 2, whereby the input range of the variable gain amplifier 90 reduces as a result.

Due to the aforementioned structure of the conventional variable gain amplifier 90, the operating current IQ0L of the differential amplifier 2 abruptly reduces following positive increase of the control voltage Vct also in the region of the control voltage Vct where the differential amplifier 2 is dominant, e.g., in the range of −0.1 V to −0.05 V shown in FIG. 14 and the voltage applied to the resistance R5 reduces, and hence the input range disadvantageously abruptly reduces.

Further, the transistors are cascode (cascaded triode)-connected with each other in three stages as in the case of the transistors Q1, Q3 and Q5, and hence the maximum permissible input amplitude of each transistor reduces. Assuming that the base-to-emitter voltage in operation of each transistor is 0.8 V and the power supply voltage is 3 V, for example, the maximum permissible input amplitude of the base electrode is about 2.2 V (3 V−0.8 V). When the transistors are cascode-connected with each other in three stages, however, the maximum permissible input amplitude of the base electrode is about 0.6 V from 3 V−(0.8×3) V. The maximum permissible input amplitude of each transistor is preferably at a high level since the transistor output is distorted if an input voltage of the base electrode exceeds this value. In general, the input range of a differential amplifier is less than the maximum permissible input amplitude of transistors forming its differential pair, and hence the input range cannot be increased if the maximum permissible input amplitude of the transistors is small.

SUMMARY OF THE INVENTION

According to a first aspect of the present invention, a variable gain amplifier comprises a load which is connected to a power source, first and second current controllers having outputs which are connected to the load in common, first and second current amplifier parts having outputs which are connected to inputs of the first and second current controllers respectively, and first and second constant current sources which are connected to the first and second current amplifier parts for supplying currents to the first and second current amplifier parts respectively, while the outputs of the first and second current controllers form an output of the variable gain amplifier, the second current amplifier part has a lower gain as compared with the first current amplifier part, the first and second current controllers adjust current quantities in opposite directions by a control signal, the first and second current amplifier parts amplify and output an input signal which is supplied in common, and the first and second current controllers adjust output distribution of the first and second current amplifier parts.

According to a second aspect of the present invention, the load is first and second resistive elements having first ends which are connected to the power source in common, the first current controller comprises a first differential pair having a first output which is connected to a second end of the first resistive element and a second output which is connected to the power source, and a second differential pair having a first output which is connected to a second end of the second resistive element and a second output which is connected to the power source, the first outputs of the first and second differential pairs form the output of the variable gain amplifier, the second current controller comprises a third differential pair having a first output which is connected to the second end of the first resistive element, and a fourth differential pair having a first output which is connected to the second end of the second resistive element, the first current amplifier part comprises a first differential amplifier having a first output which is connected to a common emitter of the first differential pair, a second output which is connected to a common emitter of the second differential pair, and emitters which are electrically connected with each other, the second current amplifier part comprises a second differential amplifier having a first output which is connected to a common emitter of the third differential pair, a second output which is connected to a common emitter of the fourth differential pair, and emitters which are electrically connected with each other, the control signal is formed by first and second control signals, the first control signal controls transistors on the first output sides of the first and second differential pairs and transistors on the second output sides of the third and fourth differential pairs, the second control signal controls transistors on the first output sides of the third and fourth differential pairs and transistors on the second output sides of the first and second differential pairs, inputs of the first and second current amplifier parts are supplied with first and second signals, the first signal controls transistors on the first output sides of the first and second differential amplifiers, and the second signal controls transistors on the second output sides of the first and second differential amplifiers.

According to a third aspect of the present invention, the variable gain amplifier further comprises a front-stage amplifier including a first load having a first end which is connected to the power source, a second load having a first end which is connected to a second end of the first load, a third current amplifier part having an output which is connected to a second end of the second load, a fourth current amplifier part having an output which is connected to the second end of the first load, and first and second variable current sources which are connected to inputs of the third and fourth current amplifier parts respectively, while the third current amplifier part has a higher gain as compared with the fourth current amplifier part, the fourth current amplifier part has a lower gain as compared with the third current amplifier part, the third and fourth current amplifier parts are supplied with an input signal, the first and second variable current sources operate by first and second variable current source control signals interlocking with the first and second control signals, a node between the third current amplifier part and the second load forms an output of the front-stage amplifier, and the output of the front-stage amplifier is connected to the inputs of the first and second current amplifier parts.

According to a fourth aspect of the present invention, the first load is third and fourth resistive elements having first ends which are connected to the power source in common, the second load is fifth and sixth resistive elements having first ends which are connected to second ends of the third and fourth resistive elements, the third current amplifier part has a differential pair having first and second outputs which are connected to second ends of the fifth and sixth resistive elements and emitters which are electrically connected with each other, the fourth current amplifier part has a differential pair having first and second outputs which are connected to the second ends of the third and fourth resistive elements and emitters which are electrically connected with each other, the first signal is outputted from a node between the first output of the third current amplifier part and the fifth resistive element, and the second signal is outputted from a node between the second output of the third current amplifier part and the sixth resistive element.

According to a fifth aspect of the present invention, the load is first and second resistive elements having first ends which are connected to the power source in common, the first current controller comprises a first differential pair having a first output which is connected to a second end of the first resistive element and a second output which is connected to the power source, and a second differential pair having a first output which is connected to a second end of the second resistive element and a second output which is connected to the power source, the first outputs of the first and second differential pairs form the output of the variable gain amplifier, the second current controller comprises a third differential pair having a first output which is connected to the first resistive element, and a fourth differential pair having a first output which is connected to the second resistive element, the first current amplifier part comprises a first differential amplifier having a first output which is connected to a common emitter of the first differential pair, a second output which is connected to a common emitter of the second differential pair, and emitters which are electrically connected with each other, the second current amplifier part comprises a second differential amplifier having a first output which is connected to a common emitter of the third differential pair, a second output which is connected to a common emitter of the fourth differential pair, and emitters which are electrically connected with each other, the control signal is formed by first and second control signals, the first control signal controls transistors on the first output sides of the first and second differential pairs and transistors on the second output sides of the third and fourth differential pairs, the second control signal controls transistors on the first output sides of the third and fourth differential pairs and transistors on the second output sides of the first and second differential pairs, inputs of the first and second current amplifier parts are supplied with first, second, third and fourth signals, the first signal controls a transistor on the second output side of the second differential amplifier, the second signal controls a transistor on the first output side of the second differential amplifier, the third signal controls a transistor on the second output side of the first differential amplifier, and the fourth signal controls a transistor on the first output side of the first differential amplifier.

According to a sixth aspect of the present invention, the variable gain amplifier further comprises first and second loads having first ends which are connected to the power source in common, a third current amplifier part having an output which is connected to a second end of the first load, a fourth current amplifier part having an output which is connected to a second end of the second load, and a front-stage amplifier having first and second variable current sources which are connected to inputs of the third and fourth current amplifier parts, while the third current amplifier part has a higher gain as compared with the fourth current amplifier part, the third and fourth current amplifier parts are supplied with an input signal, the first and second variable current sources operate by first and second variable current source control signals interlocking with the first and second control signals, the output of the third current amplifier part is connected to the input of the first current amplifier part, and the output of the fourth current amplifier part is connected to the input of the second current amplifier part.

According to an seventh aspect of the present invention, the first load is third and fourth resistive elements having first ends which are connected to the power source in common, the second load is fifth and sixth resistive elements having first ends which are connected to the power source in common, the third current amplifier part is provided with a differential pair having first and second outputs which are connected to second ends of the third and fourth resistive elements and emitters which are electrically connected with each other, the fourth current amplifier part is provided with a differential pair having first and second outputs which are connected to second ends of the fifth and sixth resistive elements and emitters which are electrically connected with each other, a first output of the fourth current amplifier part outputs the first signal, a second output of the fourth differential amplifier outputs the second signal, a first output of the third differential amplifier outputs the third signal, and a second output of the third differential amplifier outputs the fourth signal.

According to an eighth aspect of the present invention, the common emitters of the first to fourth differential pairs have serially connected seventh and eighth resistive elements respectively, and connection between the first and second current amplifier parts and the common emitters of the first to fourth differential pairs is performed on nodes between the seventh and eighth resistive elements.

The variable gain amplifier according to the first aspect of the present invention employs the constant current sources as the current sources for the first and second current amplifier parts and changes current distribution of the first and second current amplifier parts by the first and second current controllers provided on the output sides of the first and second current amplifier parts, whereby the input ranges of the first and second current amplifier parts remain unchanged even if the gain of the overall variable gain amplifier is changed. Therefore, the variable gain amplifier has a low gain as a whole, and the input range of the overall variable gain amplifier remains substantially unchanged even if the gain is changed during a dominant operation of the second current amplification. This also applies to the case of a dominant operation of the first current amplification.

The variable gain amplifier according to the second aspect of the present invention utilizes the constant current sources as the current sources for the first and second current amplifier parts and changes the current distribution of the first and second amplification parts by the first and second current controllers provided on the output sides of the first and second current amplifier parts. Thus, it is possible to obtain an actual structure of a variable gain amplifier whose input range does not abruptly change with respect to a control voltage or a variable gain amplifier preventing inputting of a signal exceeding its input range.

The variable gain amplifier according to the third aspect of the present invention controls the variable current source to increase an operating current of the low-gain fourth current amplifier part when the front-stage amplifier is supplied with a large input signal exceeding the input range of the variable gain amplifier, so that the gain of the fourth current amplifier part can dominate that of the overall variable gain amplifier. Consequently, the third current amplifier part does not amplify the large input signal. In this case, the fourth current amplification is formed to operate as an attenuator so that the front-stage amplifier operates as an attenuator when supplied with a large input signal, whereby the inputs of the first and second current amplifier parts are prevented from being supplied with a signal exceeding the input range of the variable gain amplifier. The front-stage amplifier has one input, whereby it is possible to inhibit the number of output lines from being increased due to provision of the front-stage amplifier.

In the variable gain amplifier according to the fourth or seventh aspect of the present invention, the third current amplifier part and the first variable current source are formed by two-stage cascode connection of transistors if the first and second variable current sources are formed by transistors respectively, for example, whereby a large maximum permissible input amplitude is obtained. Thus, the front-stage amplifier can cope with a signal exceeding the maximum permissible input amplitude of the variable gain amplifier and it is possible to reduce the signal below the maximum permissible input amplitude of the variable gain amplifier by employing the front-stage amplifier as an attenuator, whereby the maximum permissible input amplitude of the variable gain amplifier can be substantially increased and the input range thereof can be widened.

The variable gain amplifier according to the fifth aspect of the present invention utilizes the constant current sources as the current sources for the first and second current amplifier parts and changes current distribution of the first and second current amplifier parts by the first and second current controllers provided on the output sides of the first and second current amplifier parts. Thus, it is possible to obtain an actual structure of a variable gain amplifier whose input range does not abruptly change with respect to the control voltage or a variable gain amplifier preventing inputting of a signal exceeding its input range.

The variable gain amplifier according to the sixth aspect of the present invention controls the variable current source to increase the operating current of the low-gain fourth current amplifier part when the front-stage amplifier is supplied with a large input signal exceeding the input range of the variable gain amplifier, whereby the gain of the fourth current amplifier part can dominate the gain of the overall amplifier. Consequently, the third current amplifier part does not amplify the large input signal. At this time, the fourth current amplifier is formed to operate as an attenuator so that the front-stage amplifier operates as an attenuator when a large input signal is supplied, whereby the inputs of the first and second current amplifier parts are prevented from inputting of a signal exceeding the input range of the variable gain amplifier.

In the variable gain amplifier according to the eighth aspect of the present invention, the first to fourth differential pairs forming the first and second current controllers have the seventh and eighth resistive elements, which can act as feedback resistances for changing output characteristics of the differential pairs. When a voltage drop is caused by the feedback resistances, the base-to-emitter voltages of transistors forming the differential pairs reduce by this voltage drop. Consequently, only a small output current is obtained regardless of the control voltage, and the gain reduces. Consequently, the gain characteristic with respect to the control voltage loosens as compared with the case of having no feedback resistances. Thus, it is possible to vary the control voltage-gain characteristic by changing the values of the seventh and eighth resistive elements, whereby a variable gain amplifier which is easy to handle can be obtained. Accordingly, an object of the present invention is to obtain a variable gain amplifier whose input range does not abruptly change with respect to a control voltage, and to provide a variable gain amplifier widening its input range.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

<Conceptual Structure of the Invention>

Figure 1:
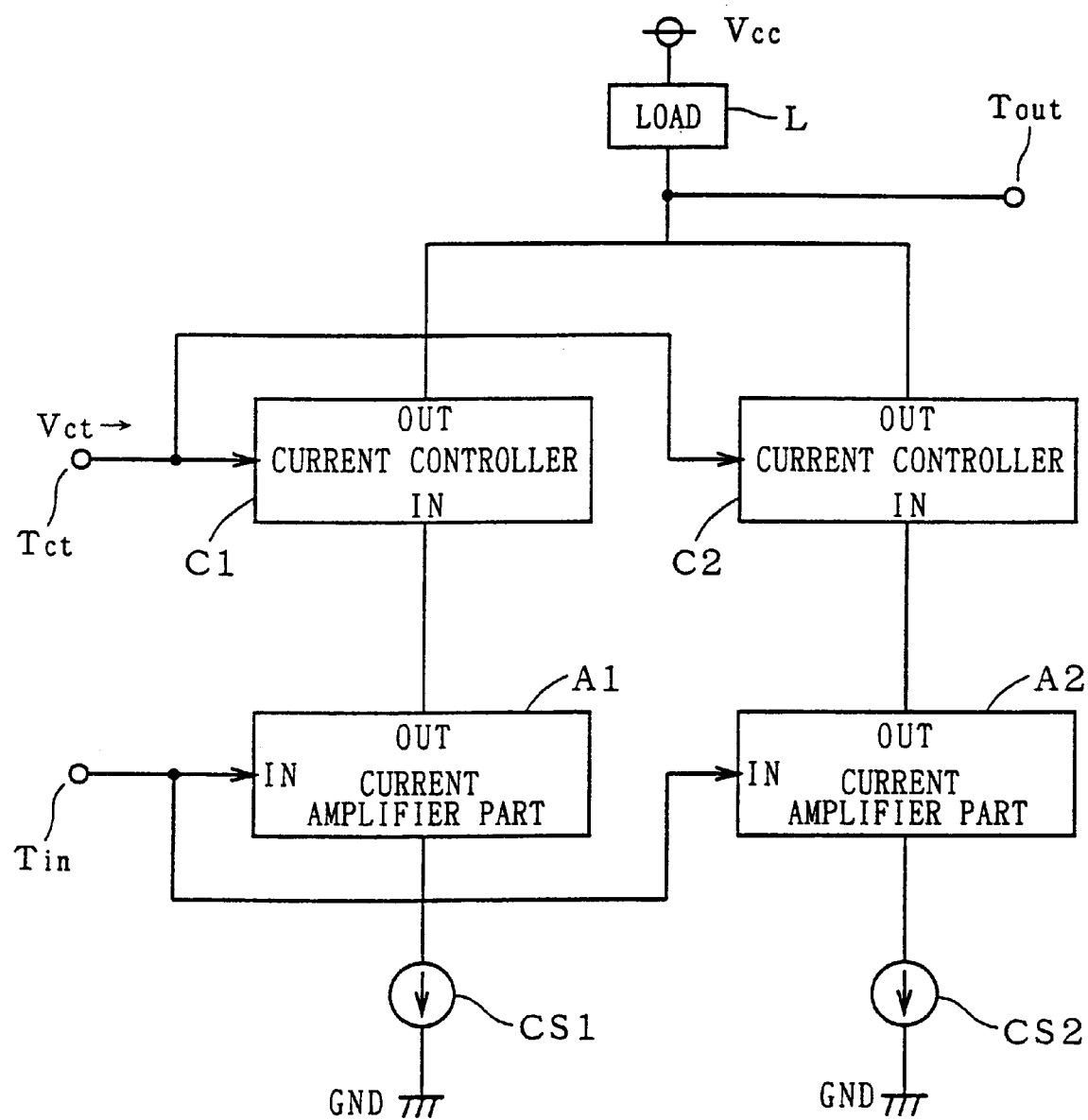
FIG. 1 illustrates the basic structure of a variable gain amplifier according to the present invention.

FIG. 1 is a block diagram showing the basic structure of a variable gain amplifier according to the present invention. Referring to FIG. 1, outputs of current controllers C1 and C2 are connected to a power source Vcc in common through a load L. Inputs of the current controllers C1 and C2 are connected to outputs of current amplifier parts A1 and A2, which are connected to ground levels GND through constant current sources CS1 and CS2 respectively.

Inputs of the current amplifier parts A1 and A2 are connected to a common input terminal Tin, and the outputs of the current controllers C1 and C2 are connected to an output terminal Tout. A control terminal Tct is connected to the current controllers C1 and C2 in common, for supplying a control voltage Vct for controlling currents fed by the current controllers C1 and C2.

The current amplifier part A1 is formed by a differential amplifier having a higher gain and a narrower input range as compared with the current amplifier part A2, which is formed by a differential amplifier having a lower gain and a wider input range as compared with the current amplifier part A1. In general, the gain and the input range of a differential amplifier is in such a trade-off relation that the input range is narrow when the gain is high as described above, for example.

<Operation>

In such a structure, current distribution can be changed by controlling output currents of the current amplifier parts A1 and A2 by the current controllers C1 and C2 respectively. In order to reduce the gain of the variable gain amplifier through this current distribution, the control voltage Vct is so adjusted as to increase the ratio of the output current of the low-gain current amplifier part A2 while reducing the ratio of the output current of the high-gain current amplifier part A1. In order to increase the gain of the variable gain amplifier, on the other hand, the control voltage Vct is reversely adjusted. Thus, the current controllers C1 and C2 are so structured as to reversely adjust the current quantities in relation to change of the control voltage Vct.

When the input terminal Tin is supplied with a large input signal, for example, the current amplifier part A1 having a narrow input range cannot cope with this and the output may be distorted. In this case, the current controller C1 reduces the output current of the current amplifier part A1 to render the distortion inconspicuous. On the other hand, the current controller C2 outputs the output, which is not distorted, of the current amplifier part A2 having a wide input range.

When the current amplifier part A2 is formed as an attenuator in this case, the output terminal Tout outputs a signal smaller than the input signal. When an extremely large signal is inputted, therefore, it is possible to prevent an internal device (not shown) connected to the output terminal Tout from breaking.

When the input terminal Tin is supplied with a small signal, on the other hand, the current amplifier part A1 can cope with this since the output is not distorted. In this case, the current controller C1 increases the output current of the current amplifier part A1, thereby bringing the output from the output terminal Tout into a level suitable for the internal device (not shown).

<Function/Effect>

In the variable gain amplifier shown in FIG. 1, as hereinabove described, the current amplifier part A2 is dominant with respect to the gain of the overall variable gain amplifier when the output current of the high-gain current amplifier part A1 is sufficiently small as compared with that of the low-gain current amplifier part A2, so that the variable gain amplifier has a low gain as a whole. When the output current of the low-gain current amplifier part A2 is sufficiently small as compared with that of the high-gain current amplifier part A1, on the other hand, the current amplifier part A1 is dominant with respect to the gain of the overall variable gain amplifier, so that the variable gain amplifier has a high gain as a whole.

The input ranges of the current amplifier parts A1 and A2 vary with operating currents thereof respectively. Thus, the constant current sources CS1 and CS2 are employed for supplying the operating currents of the current amplifier parts A1 and A2, thereby rendering the input ranges constant. Further, the current controllers C1 and C2 provided on the output sides of the current amplifier parts A1 and A2 change the current distribution of the current amplifier parts A1 and A2, to be capable of changing the gain of the overall variable gain amplifier.

Therefore, the input range of the overall variable gain amplifier remains substantially unchanged even if the control voltage Vct is adjusted to change the gain when the variable gain amplifier has a low gain as a whole and the current amplifier part A2 dominantly operates. This also applies to the case of a dominant operation of the current amplifier part A1.

Embodiments based on the aforementioned concept of the present invention are now described.

<A. Embodiment 1>

<A-1. Device Structure>

Figure 2:
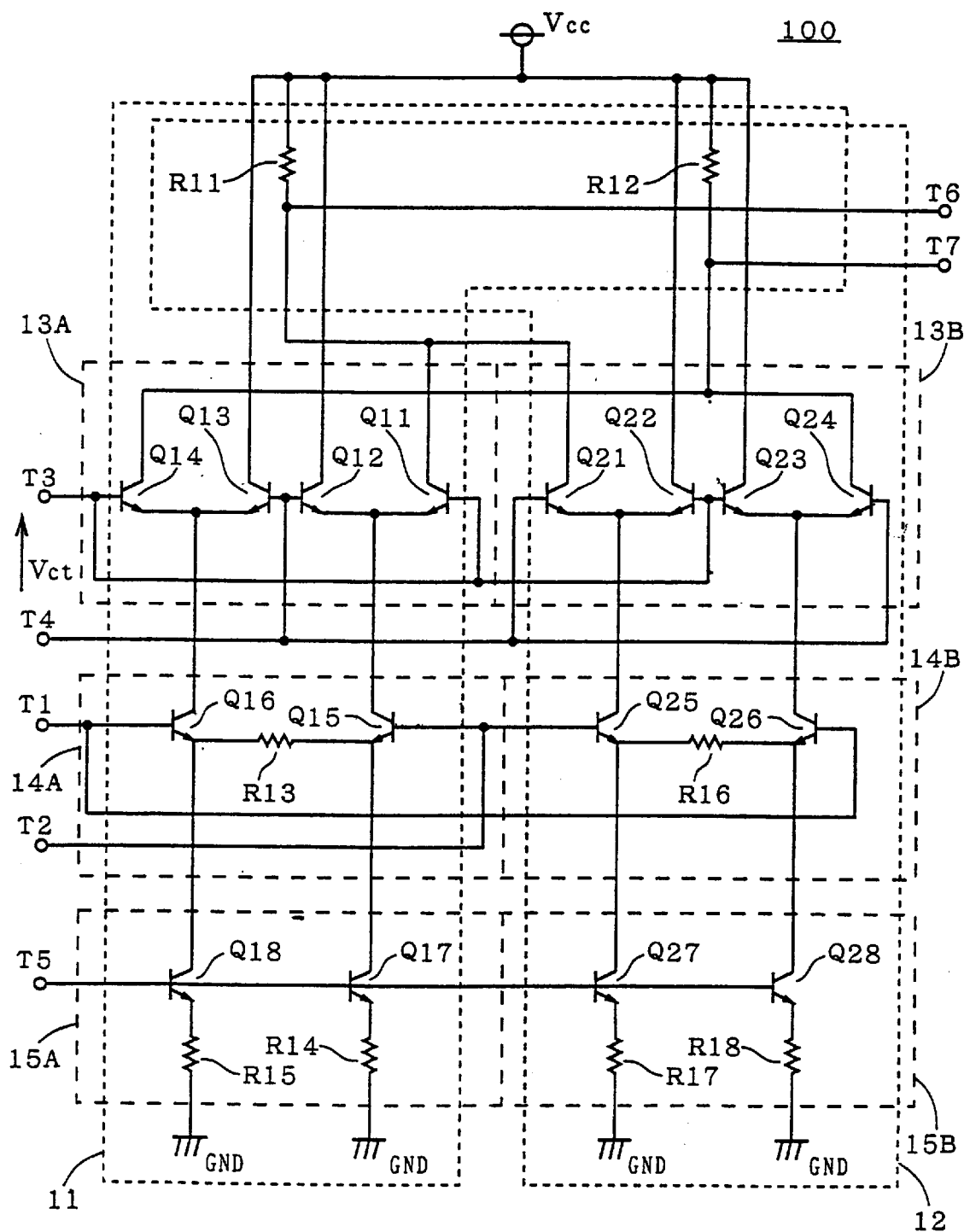
FIG. 2 shows the structure of a variable gain amplifier according to an embodiment 1 of the present invention.

FIG. 2 shows the structure of a variable gain amplifier 100 according to an embodiment 1 of the present invention. As shown in FIG. 2, the variable gain amplifier 100 comprises a high-gain differential amplifier 11 and a low-gain differential amplifier 12 having common resistances (load resistances) R11 and R12. The resistances R11 and R12 have the same resistance value $R_L$.

The differential amplifier 11 is provided with NPN transistors Q11 and Q14 having collector electrodes which are connected to second ends of the resistances R11 and R12, having the resistance value $R_L$, whose first ends are connected to a power source Vcc in common, and NPN transistors Q12 and Q13 having collector electrodes which are connected to the power source Vcc.

The emitter electrodes of the transistors Q11 and Q12 are connected to the collector electrode of an NPN transistor Q15 in common, and those of the transistors Q13 and Q14 are connected to the collector electrode of an NPN transistor Q16 in common.

The emitter electrodes such as those of the transistors Q11 and Q12 connected in common are referred to as common emitters. Further, a pair of transistors such as the transistors Q11 and Q12 having the emitter electrodes connected in common and base electrodes supplied with different signals is referred to as a differential pair.

The emitter electrodes of the transistors Q15 and Q16 are connected to the collector electrodes of NPN transistors Q17 and Q18 respectively, and mutually connected with each other through a resistance (feedback resistance) R13 (the resistance R13 may be omitted). Further, the emitter electrodes of the transistors Q17 and Q18 are connected to ground levels GND through resistances R14 and R15 respectively.

The differential amplifier 12 is provided with NPN transistors Q21 and Q24 having collector electrodes connected to the resistances R11 and R12 which are connected to the power source Vcc in common, and NPN transistors Q22 and Q23 having collector electrodes connected to the power source Vcc.

The emitter electrodes of the transistors Q21 and Q22 are connected to the collector electrode of an NPN transistor Q25 in common, and those of the transistors Q23 and Q24 are connected to the collector electrode of an NPN transistor Q26 in common. The emitter electrodes of the transistors Q25 and Q26 are connected to the collector electrodes of NPN transistors Q27 and Q28 respectively, and mutually connected with each other through a resistance (feedback resistance) R16. The emitter electrodes of the transistors Q27 and Q28 are connected to the ground levels GND through resistances R17 and R18 respectively.

The resistances R13 and R16 which are feedback resistances have resistance values $R_{EG}$ and $R_{EL}$, in the relation $R_{EG} < R_{EL}$.

The base electrodes of the transistors Q16 and Q26 are connected to an input terminal T1, and those of the transistors Q15 and Q25 are connected to an input terminal T2.

The base electrodes of the transistors Q11, Q14, Q22 and Q23 are connected to a control terminal T3, and those of the transistors Q12, Q13, Q21 and Q24 are connected to a control terminal T4.

The base electrodes of the transistors Q17, Q18, Q27 and Q28 are connected to a constant bias input terminal T5, the collector electrodes of the transistors Q11 and Q21 are connected to an output terminal T6, and those of the transistors Q14 and Q24 are connected to an output terminal T7.

A circuit formed by the transistors Q11, Q12, Q13 and Q14 is referred to as a controller 13A, and that formed by the transistors Q21, Q22, Q23 and Q24 is referred to as a current controller 13b.

Further, a circuit formed by the transistors Q15 and Q16 and the resistance R13 is referred to as a current amplifier part 14A, and that formed by the transistors Q25 and Q26 and the resistance R16 is referred to as a current amplifier part 14B.

In addition, a circuit formed by the transistors Q17 and Q18 and the resistances R14 and R15 is referred to as a constant current source 15A, and that formed by the transistors Q27 and Q28 and the resistances R17 and R18 is referred to as a constant current source 15B.

Due to the aforementioned structure, respective outputs of the current controllers 13A and 13B are connected to the load resistances R11 and R12 in common as shown in FIG. 2, whereby output currents of the differential amplifiers 11 and 12 flow to the common load resistances R11 and R12.

<A-2. Operation>

The operation of the variable gain amplifier 100 is now described. The operation is basically similar to the conceptual structure described with reference to FIG. 1. When the variable gain amplifier 100 is supplied with an input signal from the input terminals T1 and T2, the current amplifier part 14A and 14B amplify the input signal respectively. If the input signal is large, the current controller 13A attenuates a collector output of the current amplifier part 14A since an output signal may become too large or may be distorted if the high-gain current amplifier part 14A amplifies the input signal. The current amplifier parts 14A and 14B operate in opposite directions, and hence the current controller 13B outputs a collector output of the current amplifier part 14B with no attenuation. The low-gain current amplifier part 14B causes no problem by outputting the collector output with no attenuation since there is a small possibility of excessively making the output signal too large or distorting the same.

If the input signal is small, on the other hand, no sufficient output signal may result from amplification by the low-gain current amplifier part 14B. Therefore, the current controller 13B attenuates the collector output of the current amplifier part 14B while the current controller 13B outputs the collector current of the current amplification 14A with no attenuation.

Respective gains G2G and G2L of the differential amplifiers 11 and 12 and the total gain G2T of the variable gain amplifier 100 can be expressed in the following numerical formulas (4), (5) and (6) respectively:

$$G_{2G} = 20 \log 10 \left[ \frac{R_L}{\frac{V_T}{I_Q} + R_{EG}} \frac{I_{LG2}(Vct)}{I_Q} \right] \quad (4)$$

$$G_{2L} = 20 \log 10 \left[ \frac{R_L}{\frac{V_T}{I_Q} + R_{EL}} \frac{I_{LL2}(Vct)}{I_Q} \right] \quad (5)$$

$$G_{2T} = 20 \log 10 \left[ \frac{R_L}{\frac{V_T}{I_Q} + R_{EG}} \frac{I_{LG2}(Vct)}{I_Q} + \frac{R_L}{\frac{V_T}{I_Q} + R_{EL}} \frac{I_{LL2}(Vct)}{I_Q} \right] \quad (6)$$

Referring to each of the numerical formulas (4) to (6), symbol $V_T$ represents a thermal voltage expressed as $kT/q$, where k represents the Boltzmann's constant, T represents the temperature and q represents the elementary charge quantity. $I_Q$ represents the operating currents of the differential amplifiers 11 and 12, which are supplied from the constant current sources 15A and 15B at constant values. $I_{LG2}$ represents the output current of the current controller 13A, which is the total of the currents flowing through the transistors Q11 and Q14. I$_{LL2}$ represents the output current of the current controller 13B, which is the total of currents flowing through the transistors Q21 and Q24. The control voltage Vct supplied between the control terminals T3 and T4 controls the output currents I$_{LG2}$ and I$_{LL2}$.

Figure 3:
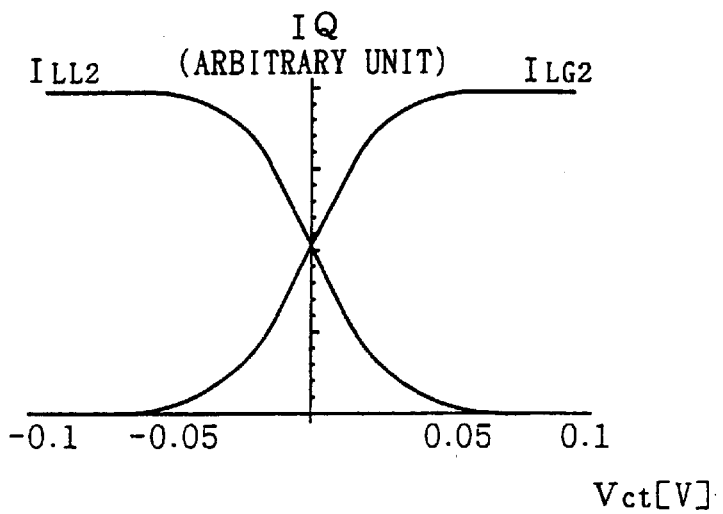
FIG. 3 illustrates operation characteristics of the variable gain amplifier according to the embodiment 1 of the present invention.

FIG. 3 shows exemplary change states of the output currents I$_{LG2}$ and I$_{LL2}$ of the current controllers 13A and 13B with respect to change of the control voltage Vct. When the control voltage Vct shown on the horizontal axis is changed in the range of ±0.1 V, the output currents I$_{LG2}$ and I$_{LL2}$ of the current controllers 13A and 13B shown on the vertical axis change substantially in the range of zero to the operating currents I$_Q$, as shown in FIG. 3.

When the control voltage Vct is gradually increased from −0.1 V, for example, the output current I$_{LG2}$ increases from a value close to zero while the output current I$_{LL2}$ gradually reduces toward a small value close to zero. Thus, it is understood from the numerical formula (6) that the total gain G$_{2T}$ increases following increase of the control voltage Vct.

<A-3. Characteristic Function/Effect>

As hereinabove described, the low-gain differential amplifier 12 is dominant in the range of the control voltage Vct where the output current I$_{LG2}$ of the current controller 13A approaches zero, while the high-gain differential amplifier 11 gradually becomes dominant following increase of the control voltage Vct. However, the values of the operating currents I$_Q$ are constant with respect to change of the control voltage Vct, and hence the respective input ranges of the differential amplifiers 11 and 12 remain unchanged. Therefore, the total input range does not abruptly changed even in the region where the control voltage Vct is small. Namely, linearity can be maintained over a wide range of the control voltage Vct.

Figure 4:
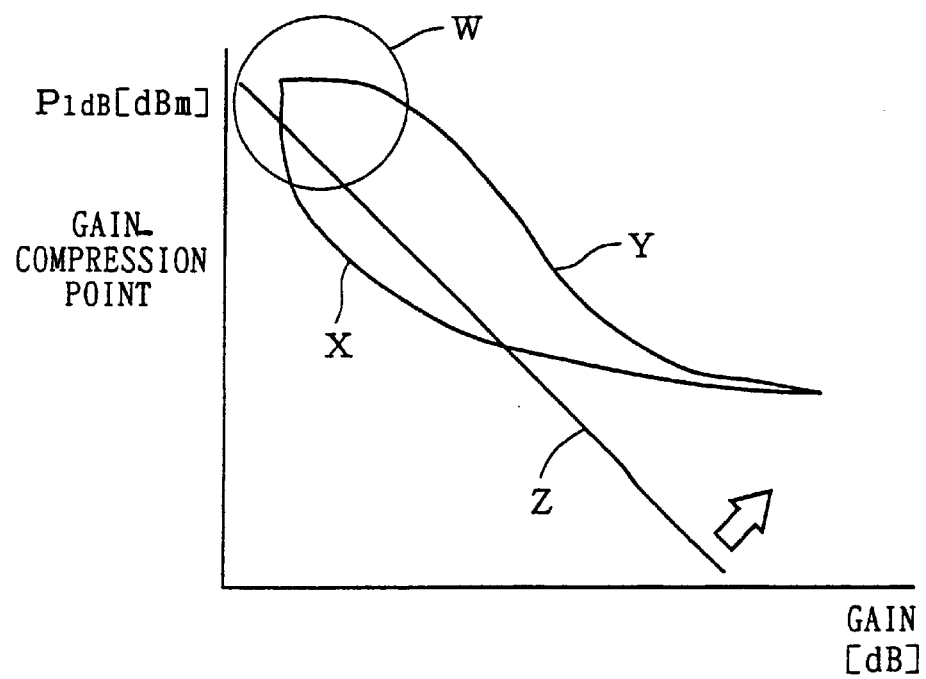
FIG. 4 is adapted to compare operation characteristics of the variable gain amplifier according to the present invention and a conventional device with each other.
Figure 13:
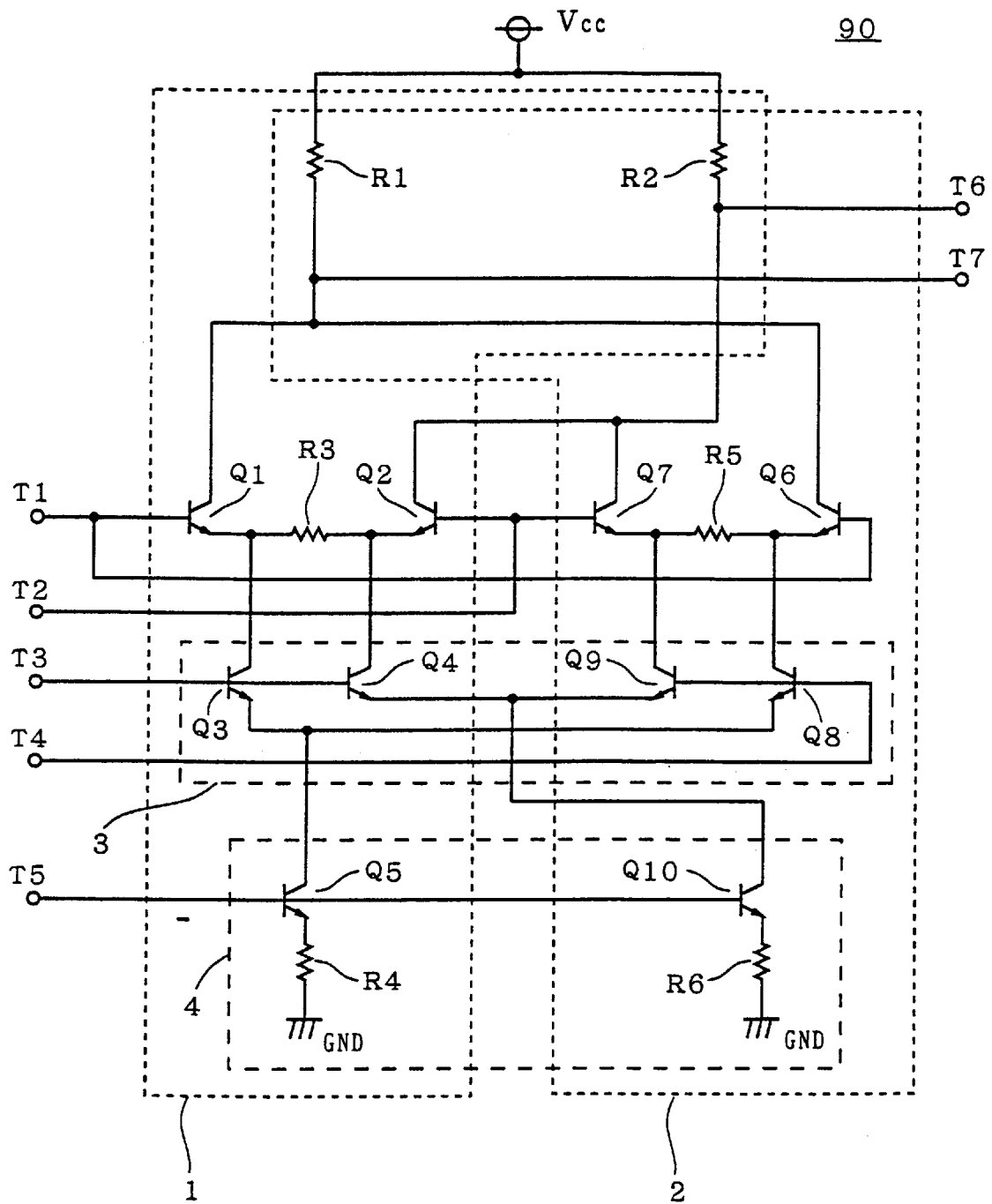
FIG. 13 illustrates the structure of a conventional variable gain amplifier.
Figure 14:
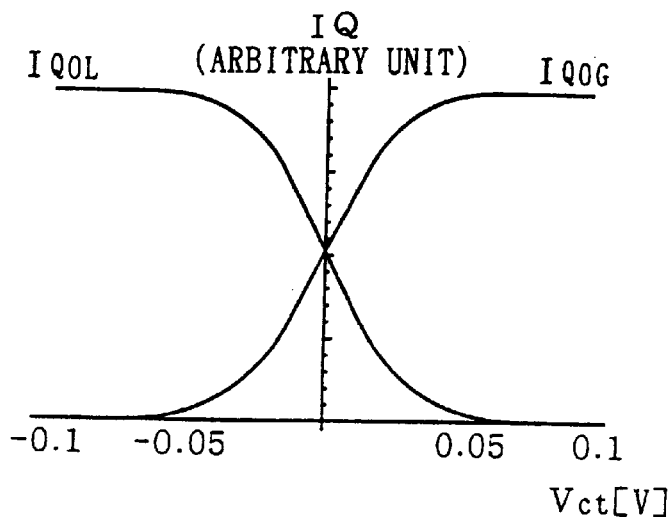
FIG. 14 illustrates output characteristics of the conventional variable amplifier.
Figure 15:
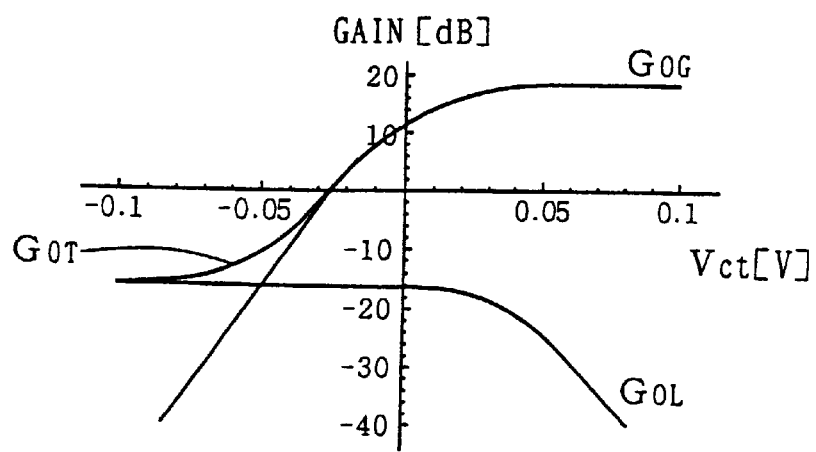
FIG. 15 illustrates the output characteristics of the conventional variable amplifier.

FIG. 4 shows the relation between the gain and the input level at a gain compression point, in order to clarify the advantage of the variable gain amplifier 100 as compared with the variable gain amplifier 90 described with reference to FIG. 13.

In case of comparing an ideal input-output characteristic (straight line) with an actual input-output characteristic of an amplifier, a point where displacement from the ideal input-output characteristic reaches 1 dB, for example, is referred to as a gain compression point (P$_{1dB}$) of 1 dB. The gain compression point is in positive correlation with the input range, and reduces following increase of the gain.

Referring to FIG. 4, characteristic curves X and Y show gain-gain compression pint characteristics of the variable gain amplifiers 90 and 100 respectively. A straight line Z shows the reference characteristic for the performance of the variable gain amplifiers 90 and 100. In general, a variable gain amplifier is employed for obtaining a constant output with respect to an input. Therefore, an allowable level at each gain is decided in the relation P$_{1dB}$+gain=C(constant value). In the variable gain amplifier, the value C in this formula must be in excess of a constant level at every gain. The straight line Z expresses this relation in FIG. 4, and the gain-gain compression point characteristic of any variable gain amplifier must be in the region above the straight line Z.

It is understood that the gain compression point P$_{dB}$ abruptly reduces following slight increase of the gain on the characteristic curve X of the conventional variable gain amplifier 90 while the gain compression point P$_{1dB}$ relatively loosely varies with change of the gain on the characteristic curve Y of the variable gain amplifier 100 according to the present invention, as shown in a region W in FIG. 4.

Thus, the variable gain amplifier 100 can maintain excellent linearity over a wide gain range.

In the aforementioned variable gain amplifier 100, the collector electrodes of the differential pairs forming the current amplifier parts 14A and 14B are connected to the load resistances R11 and R12 through the current controllers 13A and 13B. While parasitic capacitances are present between the bases and the collectors of general transistors, an input signal current is supplied to an output terminal through the parasitic capacitances if the collector currents are directly connected to load resistances (isolation is inferior). In the variable gain amplifier 100, however, the differential pairs forming the current controllers 13A and 13B are connected to the collector currents of the differential pairs forming the current amplifier parts 14A and 14B, thereby preventing the input signal from directly reaching the output terminals T6 and T7 through parasitic capacitances.

<B. Embodiment 2>

In the variable gain amplifier 100 described with reference to FIG. 2, the transistors Q14, Q16 and Q18, for example, are cascode-connected with each other in three stages, and hence the maximum permissible input amplitude of each transistor reduces. Assuming that the base-to-emitter voltage of any transistor in operation is 0.8 V and the power supply voltage is 3 V, for example, the maximum permissible input amplitude of the base electrode is about 2.2 V (3 V−0.8 V). When transistors are cascode-connected with each other in three stages, however, the maximum permissible input amplitude of each base electrode is about 0.6 V from 3 V−(0.8−3) V. The output of the transistor is distorted if the input voltage of the base electrode exceeds this value. Thus, the maximum permissible input amplitude is preferably maximized.

In the structure of the variable gain amplifier 100, however, the transistors must indispensably be cascode-connected with each other in three stages, and hence the stage number of the cascode connection cannot be reduced. The maximum permissible input amplitude of each transistor defines the upper limit of the input range, and hence increase of the input ranges of the differential amplifiers 11 and 12 is limited to disadvantageously restrict the input range of the variable gain amplifier 100.

A variable gain amplifier 100A according to an embodiment 2 of the present invention comprises a variable gain amplifier 100 and a front-stage amplifier 50, having a larger maximum permissible input amplitude than the variable gain amplifier 100, provided on its front stage, thereby substantially increasing the maximum permissible input amplitude.

Figure 5:
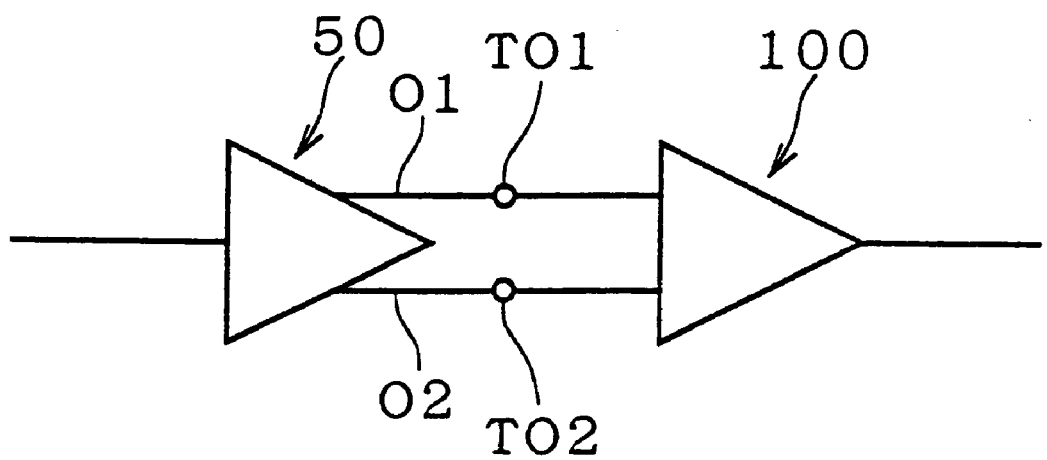
FIG. 5 illustrates the basic structure of a variable gain amplifier according to an embodiment 2 of the present invention.

FIG. 5 shows the variable gain amplifier 100A comprising the variable gain amplifier 100 and the front-stage amplifier 50 provided on its front stage. Referring to FIG. 5, the front-stage amplifier 50 has one input and two outputs, i.e., first and second outputs O1 and O2. A first output terminal TO1 outputs a signal attenuated below the maximum permissible input range (or the input range) of a low-gain differential amplifier 12 of the variable gain amplifier 100 when the front-stage amplifier 50 is supplied with a large input signal. When the front-stage amplifier 50 is supplied with an input signal smaller than the maximum permissible input amplitude (or the input range) of differential amplifiers 11 and 12 of the variable gain amplifier 100, on the other hand, a second output terminal TO2 amplifies this input signal or outputs the same as such.

The first and second output terminals TO1 and TO2 are connected to inputs of the high-gain and low-gain differential amplifiers 12 and 11 of the variable gain amplifier 100 respectively.

When the front-stage amplifier 50 is supplied with an input signal exceeding the input range of the variable gain amplifier 100, therefore, the first output terminal TO1 of the front-stage amplifier 50 supplies the attenuated input signal to the differential amplifier 12 of the variable gain amplifier 100, thereby preventing the variable gain amplifier 100 from a defective operation.

<B-1. Device Structure>

Figure 6:
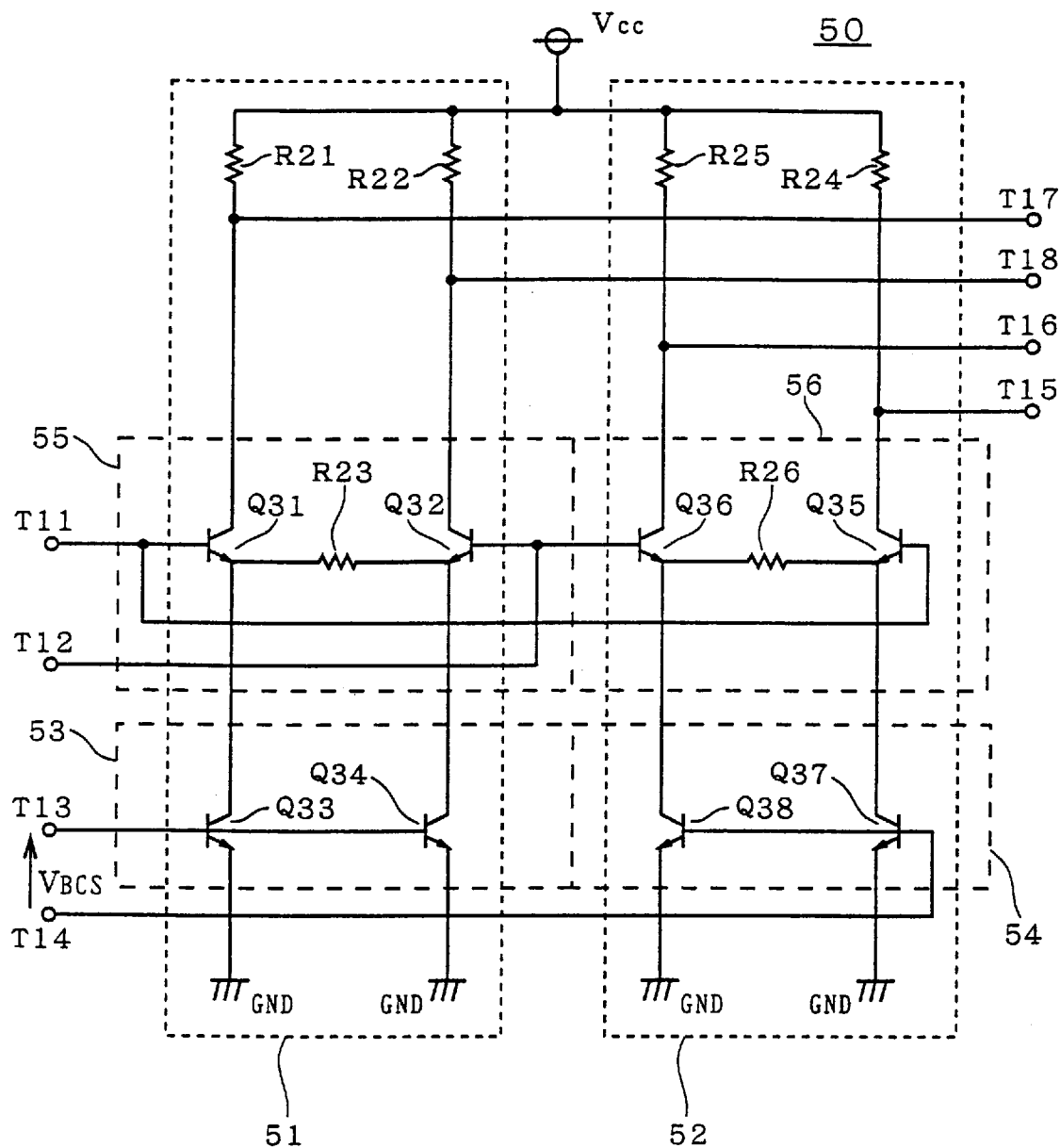
FIG. 6 shows the structure of the variable gain amplifier according to the embodiment 2 of the present invention.

The concrete structure of the variable gain amplifier 100A is now described. FIG. 6 shows the structure of the front-stage amplifier 50. As shown in FIG. 6, the front-stage amplifier 50 is formed by a high-gain differential amplifier 51 and a low-gain differential amplifier 52 which are connected to a power source Vcc.

The differential amplifier 51 is provided with NPN transistors Q31 and Q32 having collector electrodes which are connected to second ends of resistances (load resistances) R21 and R22 having first ends connected to the power source Vcc in common. The resistances R21 and R22 have the same resistance value $R_{L1}$.

The emitter electrodes of the transistors Q31 and Q32 are connected to the collector electrodes of NPN transistors Q33 and Q34 respectively, and mutually connected with each other through a resistance (feedback resistance) R23. The emitter electrodes of the transistors Q33 and Q34 are connected to ground levels GND.

The differential amplifier 52 is provided with NPN transistors Q35 and Q36 having collector electrodes which are connected to second ends of resistances (load resistances) R24 and R25 having first ends connected to the power source Vcc in common. The resistances R24 and R25 have the same resistance value $R_{L2}$. The emitter electrodes of the transistors Q35 and Q36 are connected to the collector electrodes of NPN transistors Q37 and Q38 respectively, and mutually connected with each other through a resistance (feedback resistance) R26. The emitter electrodes of the transistors Q37 and Q38 are connected to the ground levels GND. The feedback resistances R23 and R26 have values $R_{EG1}$ and $R_{EL1}$, in the relation $R_{EG1} < R_{EL1}$.

The base electrodes of the transistors Q31 and Q35 are connected to an input terminal T11, and those of the transistors Q32 and Q36 are connected to an input terminal T12.

The base electrodes of the transistors Q33 and Q34 are connected to a control terminal T13, and those of the transistors Q37 and Q38 are connected to a control terminal T14. A circuit formed by the transistors Q33 and Q34 is referred to as a variable current source 53, and that formed by the transistors Q37 and Q38 is referred to as a variable current source 54. A variable current source control signal VBCS is supplied between the control terminals T13 and T14.

The collector electrodes of the transistors Q31 and Q32 are connected to output terminals T17 and T18 respectively, and those of the transistors Q35 and Q36 are connected to output terminals T15 and T16 respectively. The output terminals T15 and T16 correspond to the first output terminal TO1 shown in FIG. 5, and the output terminals T17 and T18 correspond to the second output terminal TO2.

A circuit formed by the transistors Q31 and Q32 is referred to as a current amplifier part 55, and that formed by the transistors Q35 and Q36 is referred to as a current amplifier part 56.

Figure 7:
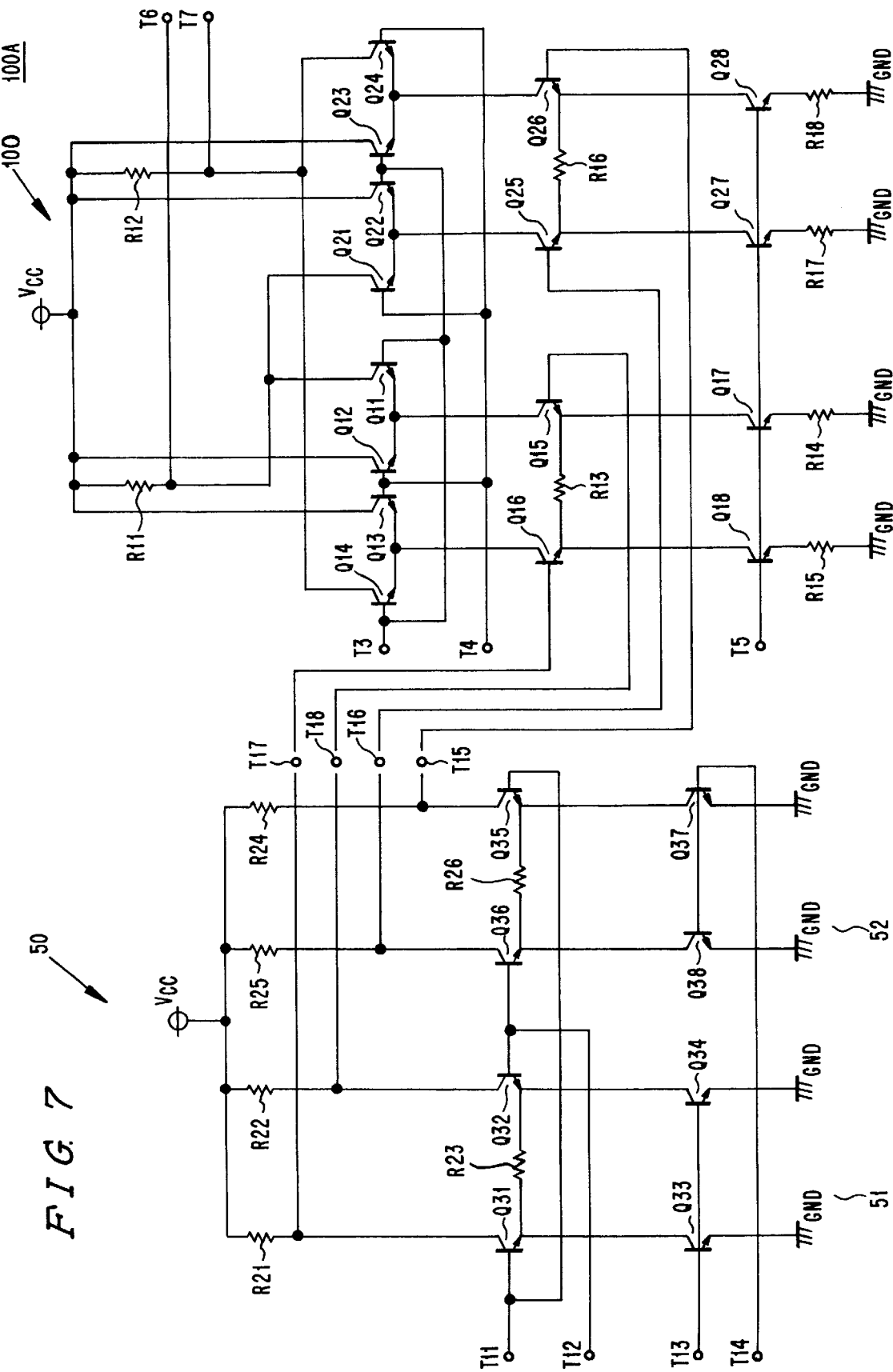
FIG. 7 shows the structure of the variable gain amplifier according to the embodiment 2 of the present invention.

FIG. 7 shows the front-stage amplifier 50 connected to the variable gain amplifier 100. As shown in FIG. 7, the structure of the variable gain amplifier 100 remains unchanged, while the output terminals T15, T16, T17 and T18 are connected to the base electrodes of transistors Q26, Q25, Q16 and Q15 of the variable gain amplifier 100 respectively.

In the aforementioned structure, it is to be noted that the transistors Q31 and Q33, for example, are cascode-connected with each other in two stages. Assuming that the base-to-emitter voltage is 0.8 V and the power supply voltage is 3 V, for example, the maximum permissible input amplitude of each transistor is about 1.4 V from 3 V–(0.8×2) in two-stage cascode connection. This value is higher by 0.8 V as compared with the value 0.6 V in the three-stage cascode connection.

<B-2. Device Operation>

The operation of the variable gain amplifier 100A is now described. When the variable gain amplifier 100A is supplied with a large input signal exceeding the input range of the variable gain amplifier 100 from the input terminals T11 and T12, the variable current source control voltage VBCS supplied between the control terminals T13 and T14 controls the transistors Q37 and Q38 to increase the operating current of the low-gain differential amplifier 52.

The variable current source control voltage VBCS is so supplied to the control terminal T14 that currents flowing through the transistors Q37 and Q38 are substantially zero when the control terminal T13 is supplied with a voltage for feeding the maximum currents to the transistors Q33 and Q34, for example. In this case, therefore, the operating current of the high-gain differential amplifier 51 reduces. The variable current source control voltage VBCS is supplied in interlock with a control voltage Vct employed for controlling the variable gain amplifier 100. When the control voltage Vct is supplied to increase from the minimum value, therefore, the variable current source control voltage VBCS is supplied to similarly increase.

When the operating current of the low-gain differential amplifier 52 increases, the gain of the differential amplifier 52 becomes dominant in relation to that of the overall front-stage amplifier 50. Thus, the variable gain amplifier 100 is prevented from supply of a large input signal through the differential amplifier 51.

When the differential amplifier 52 is structured to operate as an attenuator so that the voltages of the output terminals T15 and T16 are below the input range of the low-gain differential amplifier 12 of the variable gain amplifier 100, on the other hand, the front-stage amplifier 50 operates as an attenuator, whereby the variable gain amplifier 100 is prevented from supply of an input signal exceeding its input range.

When the input signal supplied to the front-stage amplifier 50 is within the input range of the variable gain amplifier 100, the variable current source control voltage VBCS supplied between the control terminals T13 and T14 controls the transistors Q33 and Q34 to increase the operating current of the high-gain differential amplifier 51. Thus, the differential amplifier 51 supplies the input signal to the differential amplifier 11 of the variable gain amplifier 100 as such or in an amplified state.

<B-3. Characteristic Function/Effect>

In the variable gain amplifier 100A according to this embodiment, the front-stage amplifier 50 functions as a protector when supplied with an input signal exceeding the input range of the variable gain amplifier 100, thereby preventing the variable gain amplifier 100 from a defective operation. In the front-stage amplifier 50, further, the differential amplifiers 51 and 52 are formed by the transistors which are cascode-connected with each other in two stages, whereby the maximum permissible input amplitude is increased as compared with the variable gain amplifier 100 having the differential amplifiers 11 and 12 which are cascode-connected with each other in three stages.

Thus, the front-stage amplifier 50 can cope with a signal exceeding the maximum permissible input amplitude of the variable gain amplifier 100 and reduce the signal below the maximum permissible input amplitude of the variable gain amplifier 100 by serving as an attenuator. Thus, the maximum permissible input amplitude of the variable gain amplifier 100 can be substantially increased.

While the input range of each transistor reduces when the power supply voltage lowers due to the aforementioned positive correlation therebetween, reduction of the input range can be suppressed by employing an amplifier reducing the stage number of cascode connection as the front-stage amplifier, for attaining a relatively wide input range at a low power supply voltage.

<B-4. Modification>

The aforementioned variable gain amplifier 100A comprises the one-input two-output front-stage amplifier 50 on the front stage of the variable gain amplifier 100, as shown in FIG. 5. Therefore, the variable gain amplifier 100 must have two pairs of input ends. A one-input one-output front-stage amplifier 60 which is applicable to a variable gain amplifier 100 comprising a pair of input ends is now described.

Figure 8:
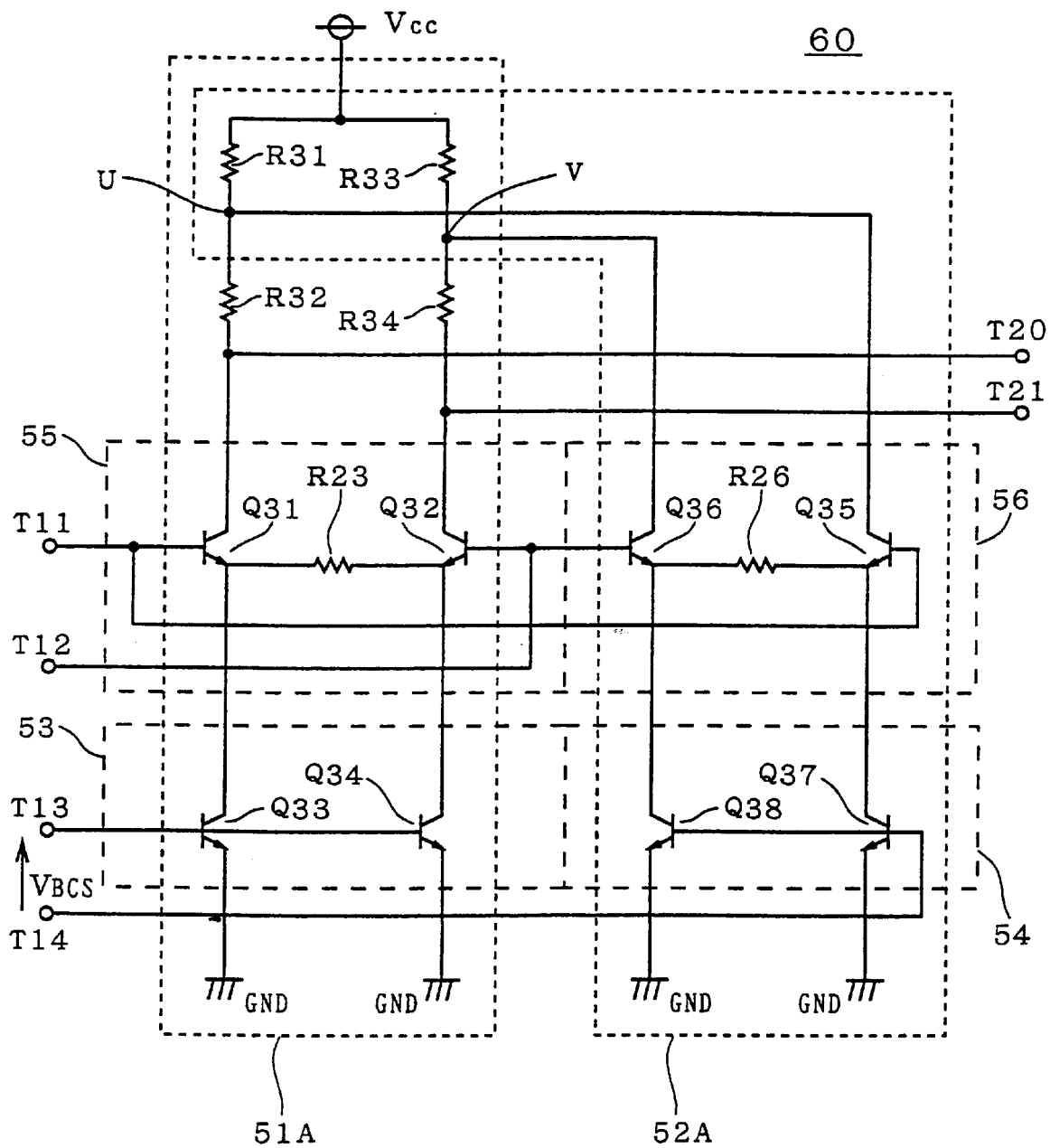
FIG. 8 shows the structure of a modification of the variable gain amplifier according to the embodiment 2 of the present invention.

FIG. 8 shows the structure of such a front-stage amplifier 60. Referring to FIG. 8, parts identical to those of the front-stage amplifier 50 described with reference to FIG. 6 are denoted by the same reference numerals, to omit redundant description.

In the front-stage amplifier 60, the collector electrode of a transistor Q31 of a high-gain differential amplifier 51A is connected to a power source Vcc through serially connected resistances (load resistances) R31 and R32, while that of a transistor Q32 is connected to the power source Vcc through serially connected resistances (load resistances) R33 and R34. The collector electrode of a high-gain differential amplifier 52A is connected to a node U between the resistances R31 and R32, while that of a transistor Q36 is connected to a node V between the resistances R33 and R34. The resistances R31 and R33 have the same resistance value $R_{L3}$, and the resistances R32 and R34 have the same resistance value $R_{L4}$.

The collector electrodes of the transistors Q31 and Q32 are connected to output terminals T20 and T21 respectively.

Therefore, the differential amplifier 51A has a resistance value $R_{L3}+R_{L4}$ as a load, and the differential amplifier 52A has the resistance value $R_{L3}$ as a load. The resistance values $R_{L3}$ and $R_{L4}$ are in the relation $R_{L3}<R_{L4}$, and feedback resistances R23 and R26 have resistance values $R_{EG1}$ and $R_{EL1}$ in the relation $R_{EG1}<R_{EL1}$.

The front-stage amplifier 60 having such a structure operates similarly to the front-stage amplifier 50 shown in FIG. 6. When an input signal is small to dominantly drive the differential amplifier 51A, an output current of the differential amplifier 52A is small and hence the output terminals T20 and T21 are supplied with an output signal of the differential amplifier 51A. When the input signal is large to dominantly drive the differential amplifier 52A, on the other hand, an output current of the differential amplifier 51A is small and hence the output terminals T20 and T21 are dominantly supplied with voltages of the nodes U and V, i.e., an output signal of the differential amplifier 52A.

Due to this structure, it is possible to suit the one-input variable gain amplifier 100 and reduce the number of output terminals, whereby the device structure is advantageously simplified.

Figure 9:
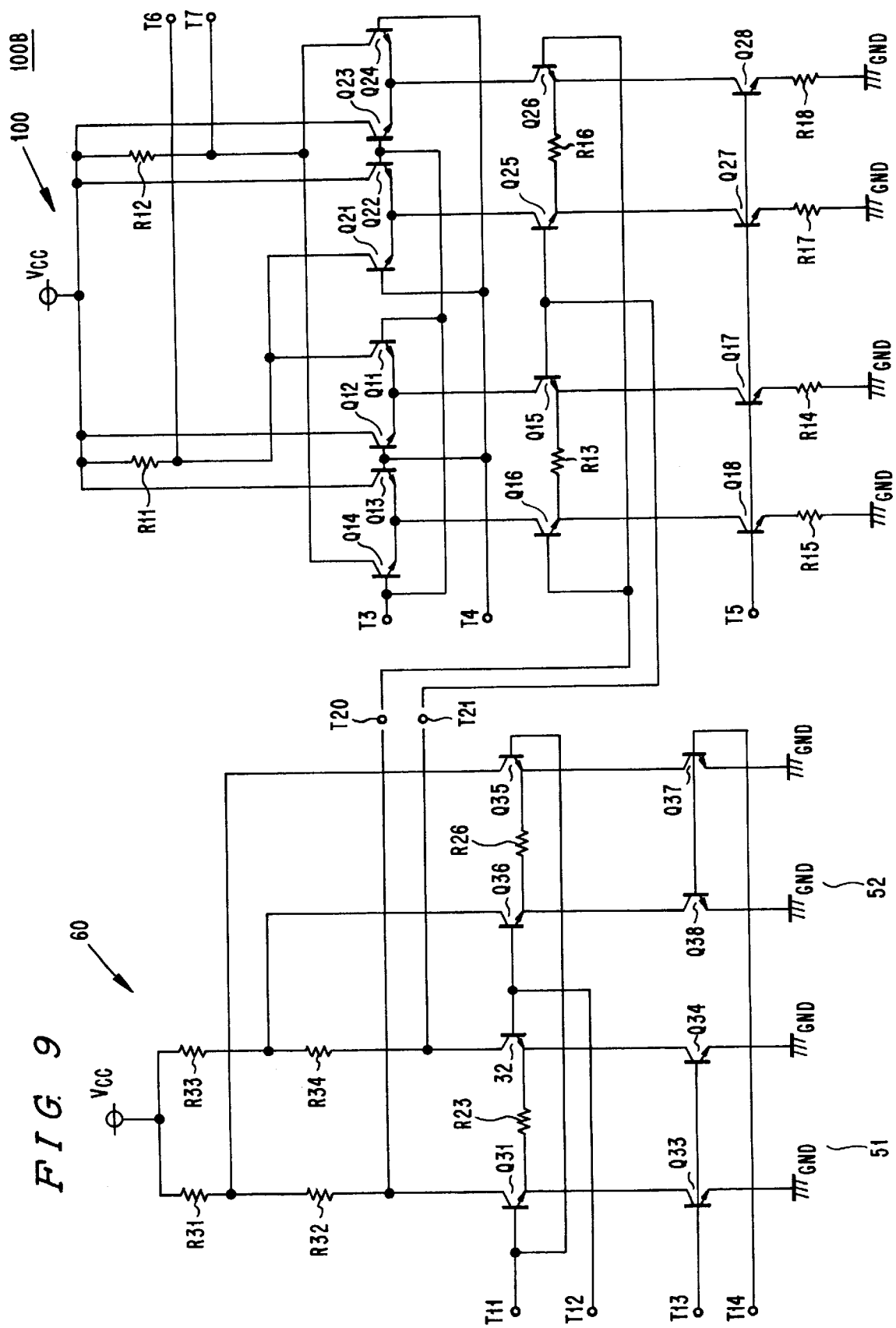
FIG. 9 shows the structure of the modification of the variable gain amplifier according to the embodiment 2 of the present invention.

FIG. 9 shows a concrete structure of a variable gain amplifier 100B having the front-stage amplifier 60 on the front stage of the variable gain amplifier 100. Referring to FIG. 9, the output terminal T20 is connected to the base electrodes of transistors Q16 and Q26, while the output terminal T21 is connected to the base electrodes of transistors Q15 and Q25.

<C. Embodiment 3>

In the variable gain amplifier 100 described with reference to FIG. 2, the current controllers 13A and 13B control the output currents of the current amplifier parts 14A and 14B thereby adjusting the output currents of the differential amplifiers 11 and 12, i.e., the gains. Therefore, the degrees of gain change of the differential amplifiers 11 and 12 with respect to change of the control voltage Vct for the current controllers 13A and 13B influence the handleability of the variable gain amplifier 100.

For example, it may be necessary to abruptly or loosely change the gains with respect to the control voltage Vct.

<C-1. Device Structure>

Figure 10:
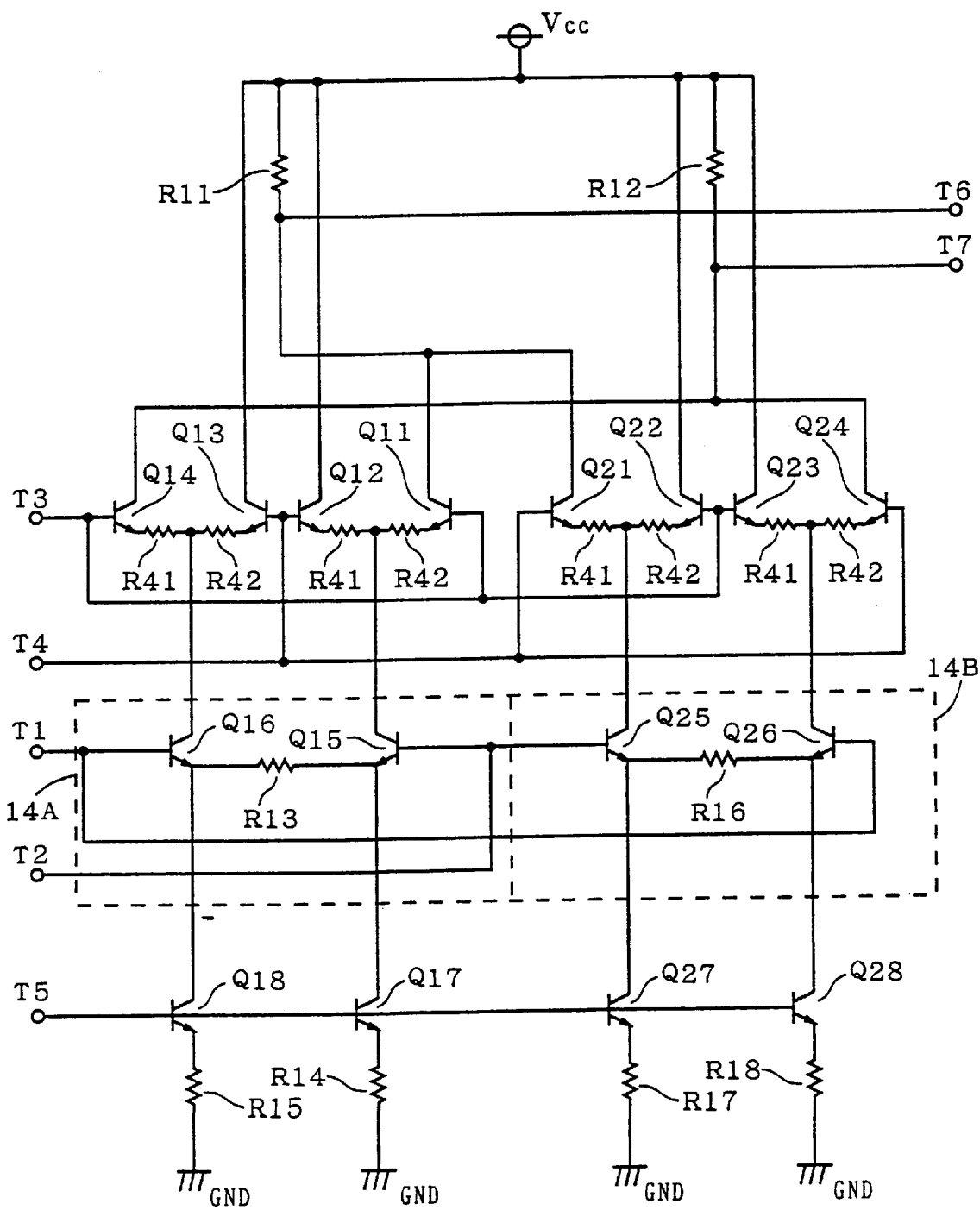
FIG. 10 illustrates the structure of a variable gain amplifier according to an embodiment 3 of the present invention.

FIG. 10 shows a variable gain amplifier 200 having a structure for providing control voltage-gain characteristics with variation.

Referring to FIG. 10, parts identical to those of the variable gain amplifier 100 described with reference to FIG. 2 are denoted by the same reference numerals, to omit redundant description.

The variable gain amplifier 200 shown in FIG. 10 is different from the variable gain amplifier 100 in a point that resistances (feedback resistances) R41 and R42 are connected between the emitter electrodes of transistors Q11 and Q12, between those of transistors Q13 and Q14, between those of transistors Q12 and Q22 and between those of transistors Q23 and Q24 respectively. Collector outputs of current amplifier parts 14A and 14B are connected to nodes between the resistances R41 and R42.

<C-2. Device Operation>

When feedback resistances are thus interposed in differential pairs, output characteristics of the differential pairs can be varied with the values of the feedback resistances. Namely, when a voltage drop is caused by any feedback resistance, the base-to-emitter voltages of the transistors forming each differential pair are reduced by this voltage drop. Consequently, only a small output current is obtained from the control voltage Vct and the gain is reduced.

Figure 11:
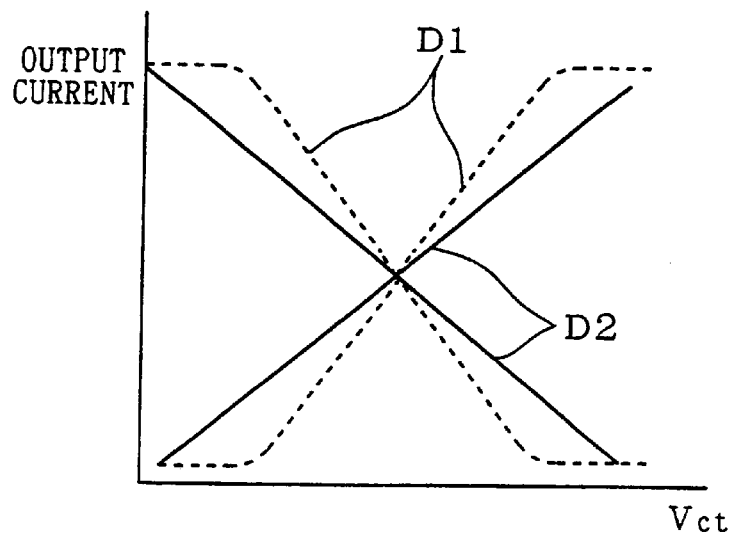
FIG. 11 illustrates output characteristics of the variable gain amplifier according to the embodiment 3 of the present invention.
Figure 12:
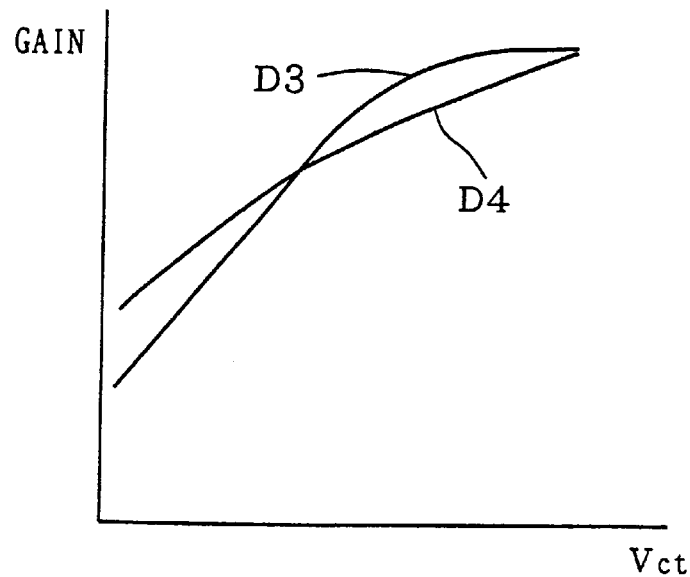
FIG. 12 is adapted to compare the operation characteristics of the variable gain amplifiers according to the embodiments 1 and 3 of the present invention with each other.

FIGS. 11 and 12 visualize the aforementioned operation. FIG. 11 typically shows output current characteristics D1 and D2 of the differential amplifiers 100 and 200 with respect to the control voltage Vct respectively.

As understood from FIG. 11, inclination of the output current characteristic D2 of the variable gain amplifier 200 is loose as compared with the variable gain amplifier 100.

FIG. 12 typically shows gain characteristics D3 and D4 of the variable gain amplifiers 100 and 200 with respect to the control voltage Vct respectively.

As understood from FIG. 12, inclination of the gain characteristic D4 of the variable gain amplifier 200 is loose as compared with the variable gain amplifier 100.

<C-3. Characteristic Function/Effect>

As hereinabove described, the control voltage-gain characteristics can be provided with variation, whereby a variable gain amplifier which is easy to handle can be obtained.

While the aforementioned embodiments 1 and 3 of the present invention employ NPN transistors, the variable gain amplifier according to the present invention can also be formed by PNP transistors, as a matter of course.

While the invention has been shown and described in detail, the following description is in all aspects illustrative and restrictive. It is therefore understood that numerous modifications and variations can be devised without departing from the scope of the invention.

We claim:

1. A variable gain amplifier comprising:

a load being connected to a power source;

first and second current controllers having outputs being connected to said load in common;

first and second current amplifier parts having outputs being connected to inputs of said first and second current controllers respectively; and first and second constant current sources being connected to said first and second current amplifier parts for supplying currents to said first and second current amplifier parts respectively, wherein said outputs of said first and second current controllers form an output of said variable gain amplifier, said first current amplifier part has a higher gain as compared with said second current amplifier part, said first and second current controllers adjust current quantities in opposite directions by a control signal, said first and second current amplifier parts amplify and output an input signal being supplied in common, and said first and second current controllers adjust output distribution of said first and second current amplifier parts.

2. The variable gain amplifier in accordance with claim 1, wherein said load is first and second resistive elements having first ends being connected to said power source in common, said first current controller comprises:

a first differential pair having a first output being connected to a second end of said first resistive element and a second output being connected to said power source, and a second differential pair having a first output being connected to a second end of said second resistive element and a second output being connected to said power source, said first outputs of said first and second differential pairs form said output of said variable gain amplifier, said second current controller comprises:

a third differential pair having a first output being connected to said second end of said first resistive element, and a fourth differential pair having a first output being connected to said second end of said second resistive element, said first current amplifier part comprises:

a first differential amplifier having a first output being connected to a common emitter of said first differential pair, a second output being connected to a common emitter of said second differential pair, and emitters being electrically connected with each other, said second current amplifier part comprises:

a second differential amplifier having a first output being connected to a common emitter of said third differential pair, a second output being connected to a common emitter of said fourth differential pair, and emitters being electrically connected with each other, said control signal is formed by first and second control signals, said first control signal controls transistors on said first output sides of said first and second differential pairs and transistors on said second output sides of said third and fourth differential pairs, said second control signal controls transistors on said first output sides of said third and fourth differential pairs and transistors on said second output sides of said first and second differential pairs, inputs of said first and second current amplifier parts are supplied with first and second signals, said first signal controls transistors on said first output sides of said first and second differential amplifiers, and said second signal controls transistors on said second output sides of said first and second differential amplifiers.

3. The variable gain amplifier in accordance with claim 2, further comprising a front-stage amplifier including:

a first load having a first end being connected to said power source, a second load having a first end being connected to a second end of said first load, a third current amplifier part having an output being connected to a second end of said second load, a fourth current amplifier part having an output being connected to said second end of said first load, and first and second variable current sources being connected to inputs of said third and fourth current amplifier parts respectively, wherein said third current amplifier part has a higher gain as compared with said fourth current amplifier part, said fourth current amplifier part has a lower gain as compared with said third current amplifier part, said third and fourth current amplifier parts are supplied with an input signal, said first and second variable current sources operate by first and second variable current source control signals interlocking with said first and second control signals, a node between said third current amplifier part and said second load forms an output of said front-stage amplifier, and said output of said front-stage amplifier is connected to said inputs of said first and second current amplifier parts.

4. The variable gain amplifier in accordance with claim 3, wherein said first load is third and fourth resistive elements having first ends being connected to said power source in common, said second load is fifth and sixth resistive elements having first ends being connected to second ends of said third and fourth resistive elements, said third current amplifier part has a differential pair having first and second outputs being connected to second ends of said fifth and sixth resistive elements and emitters being electrically connected with each other, said fourth current amplifier part has a differential pair having first and second outputs being connected to said second ends of said third and fourth resistive elements and emitters being electrically connected with each other, said first signal is outputted from a node between said first output of said third current amplifier part and said fifth resistive element, and said second signal is outputted from a node between said second output of said third current amplifier part and said sixth resistive element.

5. The variable gain amplifier in accordance with claim 2, wherein said common emitters of said first to fourth differential pairs have serially connected seventh and eighth resistive elements respectively, connection between said first and second current amplifier parts and said common emitters of said first to fourth differential pairs being performed on nodes between said seventh and eighth resistive elements.

6. The variable gain amplifier in accordance with claim 1, wherein said load is first and second resistive elements having first ends being connected to said power source in common, said first current controller comprises:
  a first differential pair having a first output being connected to a second end of said first resistive element and a second output being connected to said power source, and
  a second differential pair having a first output being connected to a second end of said second resistive element and a second output being connected to said power source,
  said first outputs of said first and second differential pairs form said output of said variable gain amplifier, said second current controller comprises:
  a third differential pair having a first output being connected to said first resistive element, and
  a fourth differential pair having a first output being connected to said second resistive element, said first current amplifier part comprises a first differential amplifier having a first output being connected to a common emitter of said first differential pair, a second output being connected to a common emitter of said second differential pair, and emitters being electrically connected with each other, said second current amplifier part comprises a second differential amplifier having a first output being connected to a common emitter of said third differential pair, a second output being connected to a common emitter of said fourth differential pair, and emitters being electrically connected with each other, said control signal is formed by first and second control signals, said first control signal controls transistors on said first output sides of said first and second differential pairs and transistors on said second output sides of said third and fourth differential pairs, said second control signal controls transistors on said first output sides of said third and fourth differential pairs and transistors on said second output sides of said first and second differential pairs, inputs of said first and second current amplifier parts are supplied with first, second, third and fourth signals, said first signal controls a transistor on said second output side of said second differential amplifier, said second signal controls a transistor on said first output side of said second differential amplifier, said third signal controls a transistor on said second output side of said first differential amplifier, and said fourth signal controls a transistor on said first output side of said first differential amplifier.

7. The variable gain amplifier in accordance with claim 6, further comprising:

first and second loads having first ends being connected to said power source in common, a third current amplifier part having an output being connected to a second end of said first load, a fourth current amplifier part having an output being connected to a second end of said second load, and a front-stage amplifier having first and second variable current sources being connected to inputs of said third and fourth current amplifier parts, wherein
  said third current amplifier part has a higher gain as compared with said fourth current amplifier part,
  said third and fourth current amplifier parts are supplied with an input signal,
  said first and second variable current sources operate by first and second variable current source control signals interlocking with said first and second control signals,
  said output of said third current amplifier part is connected to said input of said first current amplifier part, and
  said output of said fourth current amplifier part is connected to said input of said second current amplifier part.

8. The variable gain amplifier in accordance with claim 7, wherein said first load is third and fourth resistive elements having first ends being connected to said power source in common, said second load is fifth and sixth resistive elements having first ends being connected to said power source in common, said third current amplifier part is provided with a differential pair having first and second outputs being connected to second ends of said third and fourth resistive elements and emitters being electrically connected with each other, said fourth current amplifier part is provided with a differential pair having first and second outputs being connected to second ends of said fifth and sixth resistive elements and emitters being electrically connected with each other, a first output of said fourth current amplifier part outputs said first signal, a second output of said fourth differential amplifier outputs said second signal, a first output of said third differential amplifier outputs said third signal, and a second output of said third differential amplifier outputs said fourth signal.

9. The variable gain amplifier in accordance with claim 6, wherein said common emitters of said first to fourth differential pairs have serially connected seventh and eighth resistive elements respectively, connection between said first and second current amplifier parts and said common emitters of said first to fourth differential pairs being performed on nodes between said seventh and eighth resistive elements.

10. A variable gain amplifier comprising:

first and second current controllers including inputs and outputs outputting first and second currents, quantities of which currents are controlled by a control signal in directions opposite to each other;

a first load having a first end connected to a power source, and a second end connected to said outputs of said first and second current controllers in common, at which an output of said variable gain amplifier is obtained;

first current amplifier part for amplifying a first input signal based on an input signal to provide a first amplified signal for said input of said first current controller;

second current amplifier part for amplifying a second input signal based on said input signal with a gain which is lower than a gain of said first current amplifier part to provide a second amplified signal for said input of said second current controller; and first and second current sources connected to said first and second current amplifier parts supplying currents to said first and second current amplifier parts.

11. The variable gain amplifier in accordance with claim 10, wherein said first current controller includes:
a first transistor having a collector connected to said second end of said first load, a base and an emitter;
a second transistor having a collector connected to said power source, a base and an emitter, said second current controller includes:
a first transistor having a collector connected to said second end of said first load, a base connected to said base of said second transistor of said first current controller, and an emitter;
a second transistor having a collector connected to said power source, a base connected to said base of said first transistor of said first current controller, and an emitter, sum of currents in said emitters of said first and second transistors of said first current controller is determined by said first amplified signal, sum of currents in said emitters of said first and second transistors of said second current controller is determined by said second amplified signal, and said control signal is applied between said bases of said first transistors of said first and second current controllers.

12. The variable gain amplifier in accordance with claim 11, wherein said first current controller further includes
a first resistor having a first end connected to said emitter of said first transistor of said first current controller and a second end;
a second resistor having a first end connected to said emitter of said second transistor of said first current controller and a second end connected to said second end of said first resistor of said first current controller, for which said first amplified signal is provided, and said second current controller further includes
a first resistor having a first end connected to said emitter of said first transistor of said second current controller and a second end;
a second resistor having a first end connected to said emitter of said second transistor of said second current controller and a second end connected to said second end of said first resistor of said second current controller, at which said second amplified signal is provided.

13. The variable gain amplifier in accordance with claim 11, further comprising:

a second load having a first end connected to said power source, and a second end, wherein said first current controller further includes:
a third transistor having a collector connected to said second end of said second load, a base connected to said base of said first transistor of said first current controller, and an emitter,
a fourth transistor having a collector connected to said power source, a base connected to said base of said second transistor of said first current controller, and an emitter, said second current controller further includes:
a third transistor having a collector connected to said second end of said second load, a base connected to said base of said first transistor of said second current controller, and an emitter;
a fourth transistor having a collector connected to said power source, a base connected to said base of said second transistor of said second current controller, and an emitter, sum of currents in said emitters of said third and fourth transistors of said first current controller is determined by a third amplified signal set complementarily to said first amplified signal based on said first input signal, and sum of currents in said emitters of said third and fourth transistors of said second current controller is determined by a fourth amplified signal set complementarily to said second amplified signal based on said second input signal.

14. The variable gain amplifier in accordance with claim 13, wherein said first current controller further includes:
a third resistor having a first end connected to said emitter of said third transistor of said first current controller and a second end;
a fourth resistor having a first end connected to said emitter of said fourth transistor of said first current controller and a second end connected to said second end of said third resistor of said first current controller, for which said third amplified signal is provided, and said second current controller further includes;
a third resistor having a first end connected to said emitter of said third transistor of said second current controller and a second end;
a fourth resistor having a first end connected to said emitter of said second transistor of said second current controller and a second end connected to said second end of said third resistor of said second current controller, for which said fourth amplified signal is provided.

15. The variable gain amplifier in accordance with claim 13, wherein said first and second input signals are identical with each other.

16. The variable gain amplifier in accordance with claim 15, further comprising:

a front-stage amplifier including;
a first load having a first end connected to said power source and second end;
a second load having a first end connected to said second end of said first load of said front-stage amplifier and second end;
a first current amplifier part having an output connected to said second end of said second load of said front-stage amplifier;
a second current amplifier part having an output connected to a second end of said first load of said front-stage amplifier; and first and second variable current source providing first and second variable currents for said first and second current amplifier parts of said front-stage amplifier respectively, wherein
- said first current amplifier part of said front-stage amplifier has a higher gain as compared with said second current amplifier part of said front-stage amplifier,
- quantities of said first and second variable currents are controlled in directions opposite to each other, by a variable current control signal interlocking with said control signal,
- said first and second current amplifier parts of said front-stage amplifier amplify said input signal, on which said first and second input signals are based and
- said first input signal comprises a signal obtained at said second end of said second load of said front-stage amplifier.

17. The variable gain amplifier in accordance with claim 16, wherein
- said front-stage amplifier further includes third and fourth loads,
- said first current amplifier part of said front-stage amplifier further has a first and second transistors,
- said second current amplifier part of said front-stage amplifier further has a first and second transistors,
- said third load is connected between said power source and a collector of said second transistor of said second current amplifier part of said front-stage amplifier,
- said fourth load is connected between said collectors of said second transistors of said first and second current amplifier parts of said front-stage amplifier,
- bases of said first transistors of said first and second current amplifier parts of said front-stage amplifier are connected to each other, for which said input signal is provided,
- bases of said second transistors of said first and second current amplifier parts of said front-stage amplifier are connected to each other,
- currents in collectors of said first and second transistors of said first current amplifier part of said front-stage amplifier are set comprementarily based on said first variable current,
- currents in collectors of said first and second transistors of said second current amplifier part of said front-stage amplifier are set comprementarily based on said second variable current, and
- said first input signal further comprises a signal obtained at said collector of said second transistor of said second current amplifier part of said front-stage amplifier.

18. The variable gain amplifier in accordance with claim 13, further comprising:
- a front-stage amplifier including;
  - a first load having a first end connected to said power source and second end;
  - a second load having a first end connected to said power source and second end;
  - a first current amplifier part having an output connected to a second end of said first load of said front-stage amplifier;
  - a second current amplifier part having an output connected to a second end of said second load of said front-stage amplifier; and
- first and second variable current source providing first and second variable currents for said first and second current amplifier parts of said front-stage amplifier respectively, wherein
  - said first current amplifier part of said front-stage amplifier has a higher gain as compared with said second current amplifier part of said front-stage amplifier,
  - quantities of said first and second variable currents are controlled in directions opposite to each other, by a variable current control signal interlocking with said control signal,
  - said first and second current amplifier parts of said front-stage amplifier amplify said input signal, on which said first and second input signals are based,
  - said first input signal comprises a signal obtained at said second end of said first load of said front-stage amplifier, and
  - said second input signal comprises a signal obtained at said second end of said second load of said front-stage amplifier.

19. The variable gain amplifier in accordance with claim 18, wherein
- said front-stage amplifier further includes third and fourth loads,
- said first current amplifier part of said front-stage amplifier further has a first and second transistors,
- said second current amplifier part of said front-stage amplifier further has a first and second transistors,
- said third load is connected between said power source and a collector of said second transistor of said first current amplifier part of said front-stage amplifier,
- said fourth load is connected between said power source and a collector of said second transistor of said second current amplifier part of said front-stage amplifier,
- bases of said first transistor s of sai d first and second current amplifier parts of said front-stage amplifier are connected to each other, for which said input signal is provided,
- bases of said second transistors of said first and second current amplifier parts of said front-stage amplifier are connected to each other,
- currents in collectors of said first and second transistors of said first current amplifier part of said front-stage amplifier are set comprementarily based on said first variable current,
- currents in collectors of said first and second transistors of said second current amplifier part of said front-stage amplifier are set comprementarily based on said second variable current,
- said first input signal further comprises a signal obtained at said collector of said second transistor of said first current amplifier part of said front-stage amplifier, and
- said second input signal further comprises a signal obtained at said collector of said second transistor of said second current amplifier part of said front-stage amplifier.

* * * * *